US009926626B2

(12) United States Patent
Jost et al.

(10) Patent No.: US 9,926,626 B2
(45) Date of Patent: Mar. 27, 2018

(54) SYSTEM AND METHOD FOR PROCESSING SUBSTRATES

(71) Applicant: Saint-Gobain Glass France, Courbevoie (FR)

(72) Inventors: Stefan Jost, München (DE); Martin Fürfanger, Steinhöring (DE); Jörg Palm, München (DE)

(73) Assignee: Bengbu Design & Research Institute for Glass Industry, Bengbu (CN)

( * ) Notice: Subject to any disclaimer, the term of this patent is extended or adjusted under 35 U.S.C. 154(b) by 0 days.

(21) Appl. No.: 14/413,553

(22) PCT Filed: Jul. 9, 2013

(86) PCT No.: PCT/EP2013/064517
§ 371 (c)(1),
(2) Date: Jan. 8, 2015

(87) PCT Pub. No.: WO2014/009387
PCT Pub. Date: Jan. 16, 2014

(65) Prior Publication Data
US 2015/0197850 A1    Jul. 16, 2015

(30) Foreign Application Priority Data

Jul. 9, 2012 (EP) .................................... 12175591

(51) Int. Cl.
*C23C 16/458* (2006.01)
*H01L 21/67* (2006.01)
(Continued)

(52) U.S. Cl.
CPC ........ *C23C 16/458* (2013.01); *H01L 21/6776* (2013.01); *H01L 21/67173* (2013.01);
(Continued)

(58) Field of Classification Search
CPC ................................................ H01L 21/67353
(Continued)

(56) References Cited

U.S. PATENT DOCUMENTS 3,990,392 A * 11/1976 Andre ....................... B05C 9/02
117/57
5,217,053 A     6/1993 Foster et al.
(Continued)

FOREIGN PATENT DOCUMENTS

CN     101668877 A     3/2010
CN     102024870 A     4/2011
(Continued)

OTHER PUBLICATIONS

Palm, J., et al., CIS module pilot processing applying concurrent rapid selenization and sulfurization of large area thin film precursors, Thin Solid Films 431-432, 2003, pp. 514-522.

*Primary Examiner* — Gregory A Wilson
(74) *Attorney, Agent, or Firm* — Hodgson Russ LLP

(57) ABSTRACT

The present invention relates to a system for processing coated substrates, having the following features: at least one evacuable process box for accommodating at least one substrate with a gas-tightly sealable housing, which forms a hollow space, wherein the housing comprises at least one housing section, which is implemented such that the substrate is thermally treatable by incident electromagnetic thermal radiation, wherein the housing has at least one housing section coupleable to a cooling device for its cooling and at least one housing section not coupled to the cooling device, wherein the hollow space is divided by at least one separating wall into a process space for accommodating the substrate and an intermediate space, wherein the separating wall has one or a plurality of openings and is arranged between the substrate and the housing section coupled to the cooling device, and wherein the housing is (Continued)

provided with at least one sealable gas passage that opens into the hollow space, for evacuating and introducing gas into the hollow space; a cooling device for cooling the process box housing section coupleable to the cooling device; at least one loading/unloading unit for loading and/or unloading the process box; at least one heating unit for heating the substrate in the process box; at least one cooling unit for cooling the substrate in the process box; at least one pumping-out device for draining the hollow space of the process box; at least one gas supply device for supplying the hollow space of the process box with at least one gas; at least one transport mechanism, which is implemented for the purpose of executing a relative movement between, on the one hand, the process box and, on the other, the heating, cooling, and loading/unloading unit.

15 Claims, 9 Drawing Sheets

(51) Int. Cl.
  H01L 21/673 (2006.01)
  H01L 21/677 (2006.01)
  H01L 31/20 (2006.01)
(52) U.S. Cl.
  CPC .. *H01L 21/67353* (2013.01); *H01L 21/67393* (2013.01); *H01L 31/206* (2013.01)
(58) Field of Classification Search
  USPC .... 432/4, 9, 56, 81, 83, 152, 188, 217, 242, 432/243, 247
  See application file for complete search history.

(56) References Cited

U.S. PATENT DOCUMENTS

| | | | | |
|---|---|---|---|---|
| 5,443,382 A | * | 8/1995 | Tsurumi | F27B 9/028 432/128 |
| 6,769,908 B2 | * | 8/2004 | Kawase | H01L 21/67115 118/724 |
| 6,881,058 B2 | * | 4/2005 | Kawano | G03F 7/168 118/302 |
| 6,930,285 B2 | * | 8/2005 | Kojima | C03B 29/08 219/388 |
| 2001/0023055 A1 | * | 9/2001 | Sakamoto | C03C 17/002 432/18 |
| 2002/0124906 A1 | | 9/2002 | Suzuki et al. | |
| 2005/0238476 A1 | * | 10/2005 | Bernard | H01L 21/67353 118/719 |
| 2012/0304921 A1 | * | 12/2012 | Miyamoto | H01L 21/67109 118/58 |
| 2013/0122713 A1 | * | 5/2013 | Rogers | H01L 27/11521 438/715 |
| 2014/0363916 A1 | * | 12/2014 | Fuerfanger | H01L 21/67115 438/57 |

FOREIGN PATENT DOCUMENTS

| | | | |
|---|---|---|---|
| DE | 4324318 C1 | 1/1995 | |
| DE | 102008022784 A1 | 4/2007 | |
| EP | 2144026 A1 | 1/2010 | |
| EP | 2200097 A1 | 6/2010 | |
| EP | 0662247 A1 | 8/2011 | |
| JP | 2001049432 A | 2/2001 | |
| WO | 2008/085604 A2 | 7/2008 | |
| WO | WO 2011/130888 A1 * | 10/2011 | .......... H01L 31/032 |
| WO | 2012/025607 A1 | 3/2012 | |

* cited by examiner

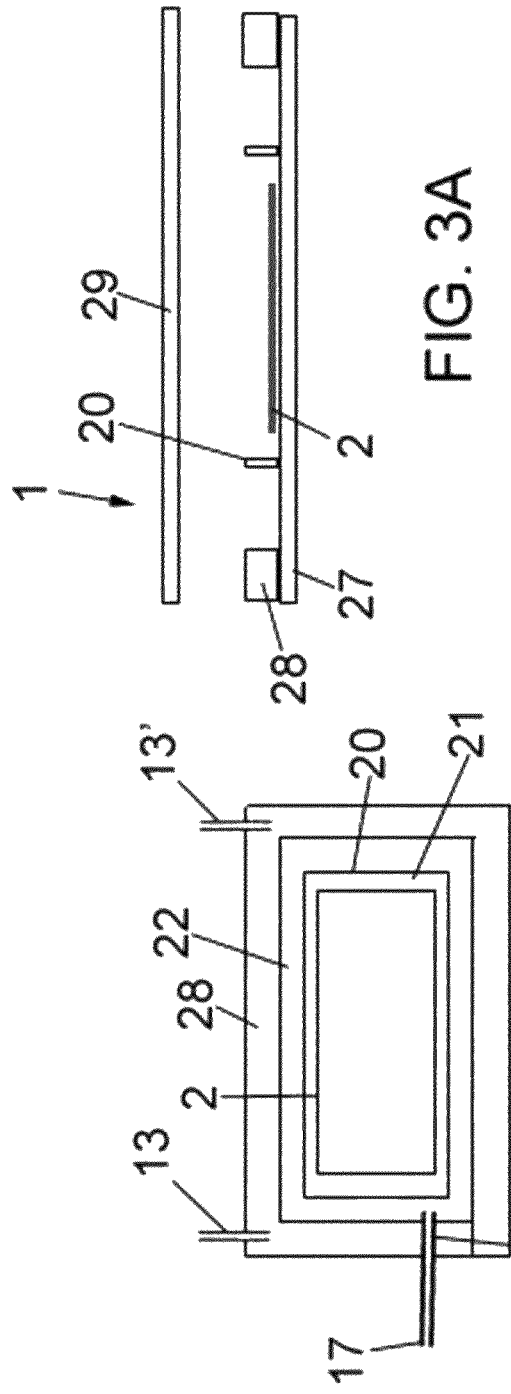
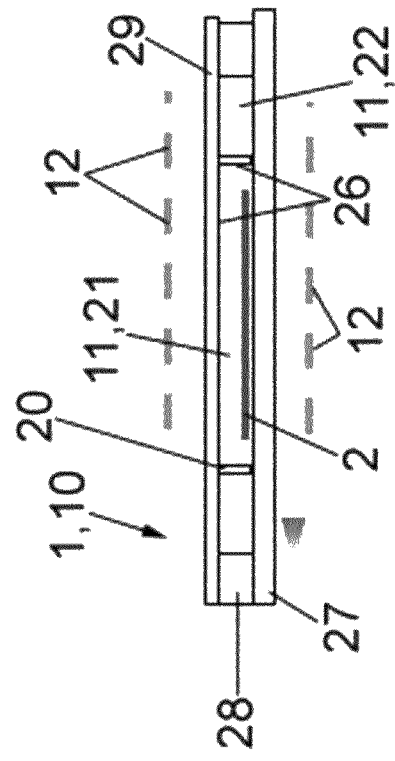

SYSTEM AND METHOD FOR PROCESSING SUBSTRATES

The invention relates to a system and a method for processing coated substrates in process boxes.

Photovoltaic layer systems for the direct conversion of sunlight into electrical energy are well known. They are commonly referred to as "solar cells", with the term "thin-film solar cells" referring to layer systems with small thicknesses of only a few microns that require substrates for adequate mechanical stability. Known substrates include inorganic glass, plastics (polymers), or metals, in particular, metal alloys, and can, depending on the respective layer thickness and the specific material properties, be designed as rigid plates or flexible films.

In view of the technological handling quality and efficiency, thin-film solar cells with absorbers made of compound semiconductors have proved advantageous. In the patent literature, thin-film solar cells have already been described frequently. Reference is made merely by way of example to the printed publications DE 4324318 C1 and EP 2200097 A1.

Mainly used as absorbers in thin-film solar cells are compound semiconductors made of chalcopyrite compounds, in particular, copper-indium/gallium-disulfur/diselenide, abbreviated as $Cu(In,Ga)(S,Se)_2$, or kesterite compounds, in particular, copper-zinc/tin-disulfur/diselenide, abbreviated as $Cu_2(Zn,Sn)(S,Se)_4$. Of the various possibilities for producing the compound semiconductor, essentially two methods have prevailed in recent years. This is vapor co-deposition of the individual elements onto a hot substrate as well as the successive application of the elements in individual layers (precursor layers) onto a cold substrate, for example, by sputtering, combined with rapid thermal processing (RTP), during which the actual crystal formation and phase conversion of the precursor layers into the compound semiconductors occurs. This last two-stage approach is described in detail, for example, in J. Palm et al., "CIS module pilot processing applying concurrent rapid selenization and sulfurization of large area thin film precursors", Thin Solid Films 431-432, pp. 414-522 (2003).

In the industrial-scale production of thin-film solar modules, the RTP thermal processing of precursor layers occurs in in-line systems, in which the coated substrates are transported sequentially into various process chambers. Such a method is known, for example, from EP 0662247 B1.

The RTP-thermal processing of precursor layers is a complex process that requires rapid heating rates in the range of a few K/s, a homogeneous temperature distribution over the substrate (laterally) and over the substrate thickness, maximum temperatures above 500° C., as well as precise control of the process atmosphere. In particular, during the production of a chalcopyrite compound, an adequately high, controllable, and reproducible partial pressure of the readily volatile chalcogen elements applied to the substrate (Se and/or S), and a controlled process gas delivery (e.g., $H_2$, $N_2$, Ar, $H_2S$, $H_2Se$, S-gas, Se-gas) must be ensured. For example, in-line selinization of a metal CuInGa-precursor layer stack requires an adequate Se quantity for complete selinization. A significant Se loss results in incomplete conversion of the precursor layers to the chalcopyrite compound and even a slight Se loss results in impaired performance of the finished thin-film solar module.

It is known to limit the process space around the coated substrate by means of a process box. The process box enables keeping the partial pressure of readily volatile chalkogen components, such as selenium or sulfur, at least largely constant during thermal processing. Moreover, the exposure of the process chamber to corrosive gases is reduced. Such a process box is known, for example, from DE 102008022784 A1.

In the in-line systems used for industrial-scale production of thin-film solar modules, the coated substrates or the process boxes loaded therewith pass through various process chambers in index operation, wherein they are transported in cycles to the respective next process chamber. The process chambers are generally designed as evacuable chambers since the entire process path must be evacuated for removal of oxygen and water. Even though processing of the substrates is usually done at normal pressure or a slightly negative pressure, gas tightness of the process chambers is required to prevent the inward diffusion of oxygen and water into the process line and the outflow of toxic gases. Only intake and outlet locks are periodically pumped out.

In general, the construction of evacuable process chambers is complex and technically demanding since the necessary vacuum tightness makes extremely high demands on materials used in system components such as vacuum feedthroughs, in particular rotary feedthroughs, valves, transport rollers, gas docking devices, cooling plates, and vacuum seals. For this reason, the investment costs for this process step account for a not insubstantial share in the overall investment costs of a solar factory. In addition, it has been shown in practice that these technically complex and relatively expensive components are subject to significantly increased wear from the transport of the coated substrates or process boxes, the heating to high maximum temperatures of more than 500° C., as well as the corrosive process atmosphere and can become leaky. In the event of a failure, the complete production chain is interrupted by the necessary maintenance work.

US Patent Application No. 2005/0238476 A1 discloses an apparatus for transporting a substrate in a controlled atmosphere with a housing that includes an evacuable substrate space for the substrate and a secondary space. The substrate space and the secondary space are separated from each other by a separating wall with nanopores, wherein the separating wall forms a micropump based on the Knudsen principle (thermal osmosis). The substrate space has a cooling plate (decontamination plate), wherein the separating wall is arranged not between the substrate and the cooling plate. Instead, the cooling plate is always arranged in a position opposite the substrate. In addition, the secondary space is thermally decoupled from the housing section or substrate space cooled by the cooling plate by the heatable separating wall. Heating is necessary for the pumping mechanism.

In contrast, the object of the present invention is to provide a capability of subjecting coated substrates to thermal processing in a technically significantly simpler and more economical system. This and other objects are accomplished according to the proposal of the invention by means of the system and method for processing coated substrates in accordance with the coordinated claims. Preferred embodiments of the invention emerge from the characteristics of the subclaims.

According to the invention, a system for processing coated substrates is presented that comprises one or a plurality of process boxes. The process boxes are provided in each case for accommodating at least one substrate and comprise a gas-tightly sealable (evacuable) housing, which forms a hollow space. The housing comprises at least one housing section, which is implemented such that the substrate is thermally treatable by electromagnetic thermal radiation incident on the housing section. In addition, the housing is provided with at least one sealable gas passage that opens into the hollow space for evacuating and introducing gas into the hollow space.

The system further comprises at least one loading/unloading unit for loading the process box with a substrate and/or removing the substrate from the process box, at least one heating unit for heating (thermal processing) of the substrate in the process box, at least one cooling unit for cooling the substrate in the process box, as well as at least one pumping-out device for evacuating the hollow space of the process box and at least one gas supply device for supplying the hollow space of the process box with at least one gas, in particular a purge gas and/or a process gas.

Furthermore, the system includes at least one transport mechanism, which is implemented to execute a relative movement between, on the one hand, the process box and, on the other, the heating, cooling, and loading/unloading unit. The transport mechanism can be implemented for the purpose of moving a transportable process box relative to the stationary heating, cooling, and loading/unloading unit. Alternatively, the process box is stationary and the transport mechanism is implemented for the purpose of moving the heating and/or cooling and/or loading/unloading unit relative to the stationary process box. The heating, cooling, and loading/unloading unit can in each case be moved individually, independent of the respective other units. It is, however, for the heating, cooling, and loading/unloading unit to be moved together (synchronously).

In the system according to the invention, it is thus not necessary to implement the heating, cooling, and loading/unloading unit as evacuable process chambers, by which means the system can be implemented very simply technically, such that the investment and maintenance costs are relatively low. Moreover, the units are subjected to relatively low wear since exposure to corrosive substances can be prevented by means of the gas-tightly sealable process boxes.

Accordingly, in an advantageous embodiment of the system according to the invention, the loading/unloading unit, the heating unit, and the cooling unit are in each case implemented as non-evacuable units. It is not precluded that the heating, cooling, and loading/unloading unit can be surrounded by a common enclosure or a respective individual enclosure in each case, which can, in particular, be connected to exhaust ventilation, but with the enclosures not being implemented as evacuable chambers.

In an advantageous embodiment of the system according to the invention, the pumping-out device and the gas supply device are integrated into the loading/unloading unit, which can be advantageous for thermal processing of substrates in terms of process technology.

Another advantageous embodiment of the system according to the invention comprises one or a plurality of process boxes, wherein the housing has at least one (first) housing section that is (thermotechnically) coupleable to or coupled to a temperature controlling or cooling device for its temperature control or active cooling and, in particular, at least one (second) housing section that is non-temperature-controllable or non-coolable, i.e., not thermally coupled to the cooling device. The first housing sections are, for example, (fluidically) connected or connectable to the cooling device and, consequently, be cooled, whereas, in contrast, the second housing sections are not connected to the cooling device and, consequently, cannot be cooled. The first housing section is different from the second housing section. The non-coolable second housing section is, in particular, that housing section that is implemented such that the substrate is thermally treatable by means of electromagnetic thermal radiation incident on the housing section. By means of the temperature control or cooling the first housing section, increased wear of vacuum-compatible components of the process box can be prevented.

Moreover, the hollow space of the process box is divided by at least one separating wall into a process space for accommodating the substrate and an intermediate space, wherein the separating wall has one or a plurality of openings and is arranged between the substrate and the first housing section temperature-controllable by the cooling device. By means of the separating wall, condensation of gaseous materials, which are formed in the process space during thermal processing, on the first section can be prevented.

The system according to the invention further includes such a temperature-controlling or cooling device for temperature control or active cooling the first housing section of the process box.

In an advantageous embodiment of the system according to the invention, the loading/unloading unit, the heating unit, and the cooling unit are in each case arranged stationarily along a circulating transport route for the process boxes, and in such a way that the transport route can be traversed unidirectionally by the process boxes, in order to process substrates. The transport mechanism is in this case implemented to transport the process boxes unidirectionally.

Another advantageous embodiment of the system according to the invention includes a serial arrangement of stationary units, consisting of one heating unit, two cooling units, which are situated on both sides of the heating unit, and two loading/unloading units for loading and/or unloading the process box, between which the other units are situated, wherein the process boxes are transportable and the transport mechanism is implemented for bidirectional transport of the process boxes. Alternatively, the mentioned units of the arrangement of this embodiment of the system are transportable and the process boxes are stationary, with the transport mechanism implemented for bidirectional transport of the units.

Another advantageous embodiment of the system according to the invention includes a serial arrangement of stationary groups of units, wherein the groups consist in each case of one cooling unit, one heating unit, one cooling unit, as well as one loading/unloading unit, in particular, in this order, with the process boxes transportable and the transport mechanism implemented for bidirectional transport of the process boxes. Alternatively, the units are each case transportable and the process boxes are stationary, with the transport mechanism implemented for bidirectional transport of the units.

Another advantageous embodiment of the system according to the invention includes a serial arrangement of stationary groups of units, wherein the groups consist in each case of one cooling unit, one heating unit, and one loading/unloading unit, in particular, in this order, with the process boxes transportable and the transport mechanism implemented for bidirectional transport of the process boxes. Alternatively, the units are in each case transportable and the process boxes are stationary, with the transport mechanism implemented for bidirectional transport of the units.

In another advantageous embodiment of the system according to the invention, the pumping-out device and/or the gas supply device and/or the temperature controlling device or cooling device are permanently coupled to a process box during a relative movement between the process box, on the one hand, and the heating, cooling, and loading/unloading unit, on the other.

The invention further extends to a method for processing coated substrates, which comprises the following steps:

Loading a hollow space of an evacuable process box with at least one coated substrate, Gas-tight sealing of the hollow space of the process box, Pumping out the hollow space of the process box, Filling the hollow space of the process box with at least one gas, in particular, for purging the hollow space with at least one inert gas and/or for filling the hollow space with at least one process gas, wherein the hollow space can be filled at negative or positive pressure, Thermal processing of the substrate by means of electromagnetic thermal radiation, which is generated by radiant heaters arranged outside the process box and impinges on at least one housing section of the process box serving for thermal processing, Cooling of the hot substrate, Removing the substrate from the process box.

In an advantageous embodiment of the method according to the invention, wherein the process box circulates unidirectionally along a closed transport route, the process box is transported successively into one loading unit for loading the process box with the substrate, at least one heating unit for thermal processing of the substrate, at least one cooling unit for cooling the substrate, as well as an unloading unit for removing the substrate from the process box.

Another advantageous embodiment of the method according to the invention comprises the following steps:

Loading a transportable process box by means of a stationary loading/unloading unit with a substrate, Transporting the process box, in particular, in one direction, to a stationary heating unit and thermal processing of the substrate, Transporting the process box, in particular, in the one direction or the opposite direction, to a stationary cooling unit and cooling the substrate, Transporting the process box, in particular, in the opposite direction, to the loading/unloading unit and removing the substrate.

An alternative embodiment of the method according to the invention comprises the following steps:

Loading one stationary process box by means of a transportable loading/unloading unit with a substrate, Removing the loading/unloading unit, in particular, in one direction, from the process box, Transporting a heating unit, in particular, in the one direction, to the process box and thermal processing the substrate, Removing the heating unit, in particular, in the other direction, from the process box, Transporting a cooling unit, in particular, in the one direction or the opposite direction, to the process box and cooling the substrate, Removing the cooling unit, in particular, in the one direction or the opposite direction, from the process box, Transporting the loading/unloading unit, in particular, in the opposite direction, to the process box and removing the substrate.

Another advantageous embodiment of the method according to the invention comprises the following steps:

Loading a transportable first process box by means of a stationary first loading/unloading unit with a first substrate, Loading a transportable second process box by means of a stationary second loading/unloading unit with a second substrate, Transporting the first process box, in particular, in one direction, to a stationary heating unit and thermal processing of the first substrate, Transporting the first process box, in particular, in the opposite direction, to a stationary first cooling unit and cooling the first substrate, Transporting the second process box, in particular, in the opposite direction, to the heating unit and thermal processing of the second substrate, Transporting the second process box, in particular, in the one direction, to a stationary second cooling unit and cooling the second substrate, Transporting the first process box, in particular, in the opposite direction, to the first loading/unloading unit and removing the first substrate, Transporting the second process box, in particular, in the one direction, to the second loading/unloading unit and removing the second substrate.

An alternative embodiment of the method according to the invention comprises the following steps:

Loading a stationary first process box by means of a first loading/unloading unit with a first substrate, Removing the first loading/unloading unit, in particular, in one direction, from the first process box, Loading one stationary second process box by means of a second loading/unloading unit with a second substrate, Removing the second loading/unloading unit, in particular, in the opposite direction, from the second process box, Transporting a heating unit, in particular, in the one direction, to the first process box and thermal processing of the first substrate, Removing the heating unit, in particular, in the opposite direction, from the first process box, Transporting a first cooling unit, in particular, in the one direction, to the first process box, and cooling the first substrate, Removing the first cooling unit, in particular, in the opposite direction, from the first process box, Transporting the heating unit, in particular, in the opposite direction, to the second process box and thermal processing of the second substrate, Removing the heating unit, in particular, in the one direction, from the second process box, and thermal processing of the second substrate, Transporting a second cooling unit, in particular, in the opposite direction, to the second process box and cooling the second substrate, Removing the second cooling unit, in particular, in the one direction, from the second process box, Transporting the first loading/unloading unit, in particular, in the opposite direction, to the first process box and removing the first substrate, Transporting the second loading/unloading unit, in particular, in the one direction, to the second process box and removing the second substrate.

Another advantageous embodiment of the method according to the invention, in which, during thermal processing of a substrate at least one gaseous substance is generated by the coated substrate, comprises the following steps:

Temperature controlling or active cooling of at least one (first) housing section of the process box during and optionally after thermal processing, Inhibiting the diffusion of a gaseous substance generated during thermal processing of the substrate to the temperature-controlled or cooled (first) housing section through a separating wall provided with one or a plurality of openings, which is arranged between the coated substrate and the temperature-controlled or cooled (first) housing section.

In the method according to the invention, the at least one housing section of the process box serving for thermal processing on which thermal radiation impinges is not temperature controlled or cooled.

In another advantageous embodiment of the method according to the invention, an intermediate space situated between the separating wall and the temperature-controlled or cooled (first) housing section is at least partially, in particular, completely, not irradiated by the electromagnetic thermal radiation.

In another advantageous embodiment of the method according to the invention, a (total) opening area of the one or a plurality of openings of the separating wall is reduced during thermal processing by heating the separating wall to a maximum of 50%, preferably a maximum of 30%, more preferably a maximum of 10%, of the starting value (total opening area before thermal processing).

In another advantageous embodiment of the method according to the invention, the hollow space of the process box is evacuated before thermal processing of the coated substrate and/or filled with a process gas (at a negative or positive pressure).

In the various embodiments of the method according to the invention, in which the process box is stationary and the heating, cooling, and loading/unloading unit are transported relative to the stationary process box, the heating, cooling, and loading/unloading unit can be moved in each case individually, independent of the respective other units. It is, however, also possible for the heating, cooling, and loading/unloading unit to be moved together (synchronously).

As described, the process box for processing a coated substrate can optionally be used as a transportable or stationary process box.

In the context of the invention, the term "substrate" refers to a flat object, which has two surfaces placed opposite each other, wherein, typically, a layer structure including a number of layers is applied on one of the two surfaces. The other surface of the substrate is usually not coated. For example, it is a substrate for production of a thin-film solar module coated with precursor layers of a compound semiconductor (e.g., a chalkopyrite or kesterite compound) that must be subjected to RTP-thermal processing.

The process box includes a housing, by means of which a gas-tightly sealable (evacuable) hollow space is formed or delimited. The clear height of the hollow space is preferably dimensioned such that gases can be pumped out in the shortest possible time and the high demands with regard to oxygen content and partial water pressure during RTP thermal processing can be met. The housing can, in principle, be made from any material suitable for the intended use, for example, metal, glass, ceramic, glass ceramic, carbon fiber reinforced carbon materials, or graphite.

It is essential here that the housing of the process box have one or plurality of housing sections, which are in each case implemented to enable thermal processing by means of electromagnetic thermal radiation incident on the housing section. The housing sections serving for thermal processing can be, for this purpose, transparent, partially transparent, or opaque to electromagnetic thermal radiation for processing the substrate. For example, the housing sections serving for thermal processing are made of glass ceramic. The housing sections serving for thermal processing can, in particular, even contain a material (e.g., graphite) or be made of a material that is suitable to at least partially, in particular, completely, absorb the electromagnetic thermal radiation of radiant heaters in order to be heated themselves. The heated housing section can then serve as a secondary heat source for heating the substrate, which can, in particular, result in homogenization of the heat distribution.

The housing of the process box further includes one or a plurality of temperature-controllable or coolable (first) housing sections, whose temperature can be set to a pre-definable temperature value or is actively coolable. The housing sections are, for this purpose, thermotechnically coupleable or coupled in each case to an (external) temperature-controlling or cooling device. Moreover, the housing includes one or plurality of non-temperature-controllable, i.e., not coupleable or coupled to the temperature controlling or cooling device, (second) housing sections, which are, in particular, those housing sections that enable thermal processing by means of electromagnetic thermal radiation incident on the housing section, in other words, lie in the radiation field of the radiant heaters.

The temperature-controllable or coolable housing sections are actively coolable, with regard to the temperature of the substrate and those housing sections, that enable thermal processing by incident electromagnetic thermal radiation and lie in the radiation field of the radiant heaters. The temperature-controllable or coolable housing sections of the process box can be temperature-controlled (actively cool) before, during, and/or after thermal processing of the coated substrate.

As used here and in the following, the term "coolable" refers to temperature controlling or cooling of the (first) housing section to a temperature that is lower than the temperature of the substrate during thermal processing or those housing sections that enable thermal processing by incident electromagnetic thermal radiation and lie in the radiation field of the radiant heaters. For example, the housing section is temperature controlled or cooled to a temperature in the range from 20° C. to 200° C. Because of this temperature control, the plastic seals customary in vacuum technology (elastomers, fluoroelastomers) and other comparatively economical standard components can be used for the vacuum sealing of the process box, which, however, do not withstand temperatures above 200° C. long-term.

Moreover, the housing of the process box includes at least one gas passage that opens into the hollow space sealable (for example, by means of a valve) for evacuating the hollow space and introduction of a process gas into the hollow space. The gas passage can open, for this purpose, in particular into the intermediate space. The process gas can, for example, contain reactive gases such as $H_2S$, $H_2Se$, S vapor, Se vapor, or $H_2$ as well as inert gases such as $N_2$, He, or Ar.

In the process box, the hollow space formed by the housing is divided by at least one separating wall into a process space for accommodating the coated substrate and an intermediate space, wherein the separating wall is arranged between the coated substrate and the housing section that is temperature-controlled (actively cooled), i.e., coupleable or coupled to the cooling device. The process space is enclosed exclusively by the at least one separating wall and one or a plurality of housing sections of the process box that are not temperature-controlable, i.e., not coupled to the cooling device.

Is essential here that the separating wall serves as a diffusion barrier (vapor barrier) for a gas exchange between the process space and the intermediate space during thermal processing, but enables a gas exchange between the process space and the intermediate space, at least temporarily, before and after thermal processing such that pumping out of gaseous substances from the process space, purging with a purge gas, as well as filling with a process gas through the separating wall is possible. The separating wall has, for this purpose, one or a plurality of openings or breaks, through which the process space and the intermediate space are fluidically connected to each other. Generally speaking, the openings can have any shape, for example, a slot shape or a round hole shape, and can even be arranged on the periphery.

In one advantageous embodiment, the separating wall does not reach all the way to a housing wall such that an opening, in particular, a gap, remains between the separating wall and the housing wall.

In particular, the separating wall can be made of a porous material or a material provided with tubes (straight, oblique, or angled tubes) or include such a material.

For example, but not absolutely necessarily, one smallest dimension, for example, a radius or diameter of a respective opening of the separating wall is greater than the length of the mean free path of the gas particles in the process space.

Thus, a process space for processing the coated substrate is formed by the separating wall, which process space is separated quasi-gas-tightly from the intermediate space by the separating wall. In contrast to an open process space, which permits a free gas exchange between the process space and the external surroundings, as well as to a gas-tight process space, in which such a gas exchange between the process space and the external surroundings is completely suppressed, the gas exchange between the process space and the intermediate space is inhibited by the separating wall. This vapor barrier is based on the pressure dependency of the length of the free path: at approximately normal pressure (700-1000 mbar), the diffusion through the comparatively small openings is inhibited. If, in contrast, the intermediate space is evacuated to pressures in the pre-vacuum range (10-1000 μbar), the free path length is greatly increased and the separating wall represents only a weak diffusion barrier for the gas exchange. The process space can be pumped out through the separating wall and after the pumping out into the process box, process gas also flows into the process space. In particular, by means of the quasi-gas-tight separating wall, the partial pressure of readily volatile chalcogen components such as selenium or sulfur can be kept at least largely constant during thermal processing in the process space.

In general, the process box is implemented such that it can be opened or closed or assembled and (nondestructively) disassembled again for loading with a coated substrate and for removal of the processed substrate.

Multiple advantages can be obtained by means of the process box. Thus, through the gas-tight implementation of the hollow space with at least one sealable gas passage that opens into the hollow space, evacuation of the process space is possible, in particular for pumping out corrosive process gases and reduction of the oxygen content and partial water pressure, as well as purging with inert gas and filling with process gas. Consequently, it is unnecessary to make locks and process units for thermal processing of the substrate gas-tight or evacuable such that the system is greatly simplified from a technical standpoint and the costs for its production and maintenance can be significantly reduced. The loading/unloading station, the heating station, and the cooling station can, however, be surrounded in turn by one common or respective individual housings that are, in particular, connected to exhaust ventilation, which are, however, not implemented as evacuable chambers. Since corrosive process gases are present exclusively in the hollow space of the process box, increased wear of components of the system such as transport rollers for transport of the process box or radiant heaters for thermal processing of the coated substrate can be avoided. In addition, moving parts can advantageously be dispensed with in the vacuum-compatible zone (process box) of the system. An evacuation of the hollow space of the process box can be accomplished quickly and efficiently. This applies equally for a filling with a process gas, wherein the process gas can be cost-effectively used in a minimum amount. The temperature control (active cooling) of at least one housing section of the process box enables a reduction in the wear, in particular of vacuum-compatible components of the process box during thermal processing and, optionally, support of the active cooling of the coated substrate after the thermal processing. By means of the separating wall acting as a diffusion barrier or vapor barrier, condensation of volatile components, such as the chalcogen elements sulfur and selenium, generated during thermal processing, on the temperature-controlled (actively cooled) housing section can be prevented in order to thus minimize the loss of volatile components in the process atmosphere and to keep their partial pressure in the process atmosphere at least largely constant. The consumption of volatile chalcogen elements can thus be minimized and the quality of the compound semiconductors produced can be improved. In addition, by means of the separating wall, the process space can be even further reduced compared to the hollow space of the process box. By means of the gas-tight process box, the substrate loaded into the process box is well protected against environmental influences. In a production system, the loaded process box can be transported between various process units without having to remove the coated substrate from the process box. The process box can be selectively loaded with one or a plurality of coated substrates, whereby loading with a plurality of substrates can be preferred to increase the throughput.

As already mentioned, by means of the separating wall, a quasi-gas-tight division of the hollow space into a process space and an intermediate space is obtained, wherein the separating wall is provided for this purpose with one or a plurality of openings. Preferably, the separating wall is implemented such that during thermal processing a loss in mass of a gaseous substance generated by thermal processing of the coated substrate out of the process space is less than 50%, preferably less than 20%, more preferably less than 10%, of the mass of the gaseous substance generated during thermal process. Advantageously, the separating wall is implemented for this purpose such that an area ratio, formed from a (total) opening area of the one or a plurality of openings divided by an inner surface (interior area) of the process space, is in the range from $5 \times 10^5$ to $5 \times 10^4$. Thus, it can advantageously be achieved that the (total) opening area of the one or a plurality of openings of the separating wall is, on the one hand, adequately large to enable a rapid evacuation of the process space as well as a filling with purge gas or process gas and is, on the other, adequately small such that the separating wall serves as an effective vapor barrier or diffusion barrier for volatile components generated in the process space during thermal processing.

In a particularly advantageous embodiment of the process box, the separating wall contains or is made of a material that has such a coefficient of thermal expansion that a (total)

opening area of the one or a plurality of openings is reduced by heating the separating wall during the thermal processing to a maximum of 50%, preferably a maximum of 30%, more preferably a maximum of 10%, of the starting value (total opening area before thermal processing). Advantageously, for this purpose, the separating wall contains or is made of a material with a coefficient of thermal expansion of more than $5 \times 10^{-6}$ $K^{-1}$. In this manner, a temperature-controlled separating wall is created with which, on the one hand, an especially efficient pumping out of the process space as well as filling of the process space with purge gas or process gas is obtained in the cold state through a larger (total) opening area; on the other hand, an especially effective inhibition of the diffusion from the process space into the intermediate space of gaseous substances generated during thermal processing is obtained in the warmer state during thermal processing by thermal expansion through a smaller (total) opening area. In particular, the separating wall can be implemented such that during the thermal processing, the (total) opening area is reduced at least approximately to zero, such that a gas exchange between the process space and the intermediate space is almost completely suppressed during thermal processing.

In an advantageous embodiment of the process box, the housing of the process box comprises a bottom, a cover, as well as a frame connecting the bottom and the cover to one another. The bottom and the cover are realized, for example, in each case as plates, wherein the bottom and/or the cover are made of a material (e.g., glass ceramic) such that the coated substrate can be thermally processed by the radiant energy of thermal radiation fed on the underside of the bottom and/or the top side of the cover. The temperature-controllable (actively coolable) housing section is formed by at least one frame section. Also, the frame can be provided with the at least one sealable gas passage that opens into the hollow space in order to evacuate the hollow space and to selectively provide the process space with a specific gas atmosphere during specific process steps.

In the assembled state of the process box, the hollow space is implemented gas tight, while, for example, the cover can be implemented removable from the frame such that in a simple manner, the process space can be loaded with a coated substrate or the processed substrate can be removed. In a particularly advantageous embodiment of the process box, the frame comprises a first frame part fixedly connected to the bottom and a second frame part fixedly connected to the cover, with the two frame parts being gas-tightly joinable to each other to form the hollow space.

In an alternative embodiment to this, the process box comprises a housing with a one-piece housing section with a housing opening, which can be sealed by a preferably temperature-controllable (actively coolable) seal, for example, laterally. The separating wall is, for example, parallel to the seal.

Further shown is an arrangement for processing a coated substrate, with a process box implemented as described above, one or a plurality of radiant heaters for generating electromagnetic thermal radiation, which are arranged adjacent to the at least one housing section of the process box serving for thermal processing, as well as a temperature-controlling device or cooling device, which is coupled thermotechnically to the at least one temperature-controllable (actively coolable) housing section for its temperature control (active cooling).

In the above arrangement, the radiant heaters are, particularly advantageously arranged such that the intermediate space is situated at least partially, in particular completely, outside a common radiation field of the radiant heaters. By means of this measure, it can be accomplished that a temperature gradient (temperature barrier) is set between the separating wall and the temperature-controllable (actively cooled) housing section of the process box. Preferably, the temperature gradient is such that a process temperature for thermal processing of the coated substrate is obtained on the separating wall. The radiant heaters can be arranged, for example, for this purpose, exclusively above and/or below the process space.

It is understood that the various embodiments of the invention can be realized individually or in any combinations. In particular, the above-mentioned characteristics and those to be explained below can be used not only in the combinations indicated but also in other combinations or in isolation without departing from the scope of the present invention.

BRIEF DESCRIPTION OF THE DRAWINGS

The invention is now explained in detail with reference to the accompanying figures. They depict, in simplified representation not true to scale:

FIG. 3A-3C using various representations, an exemplary embodiment of the process box of FIG. 1;

In FIG. 1 through 5A-5F, a process box horizontally oriented in a typical operating position is illustrated. It is understood that the process box can also be oriented differently and that the position and direction indications made in the following description refer only to the representation of the process box in the figures, with this not to be construed as limiting.

Figure 1:
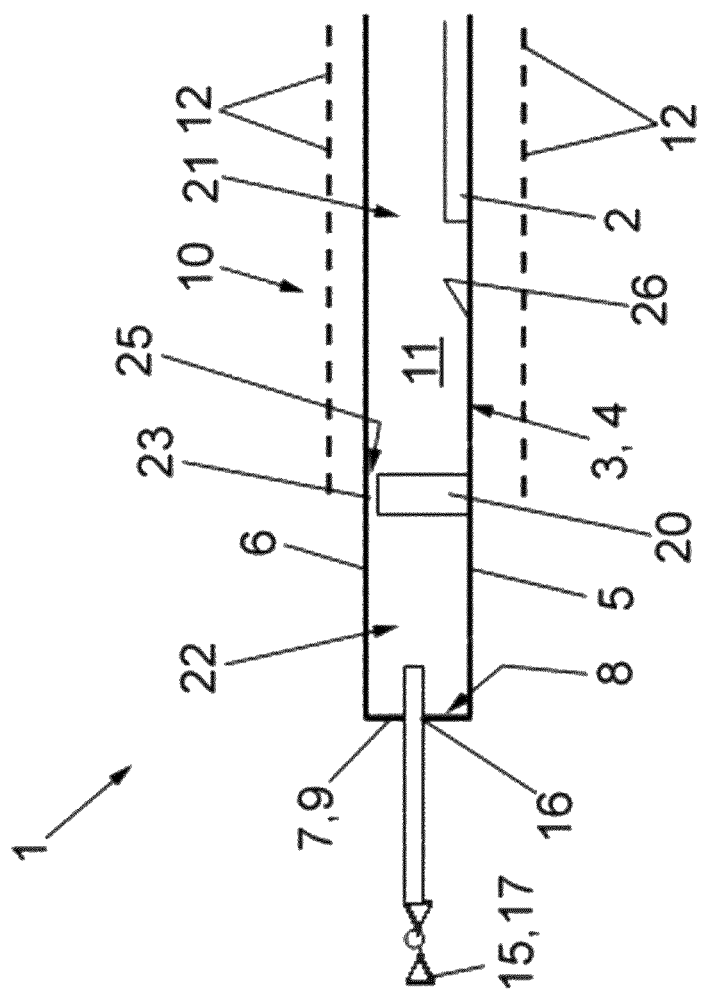
FIG. 1 a generalized cross-sectional representation of a process box for processing a coated substrate.
Figure 2:
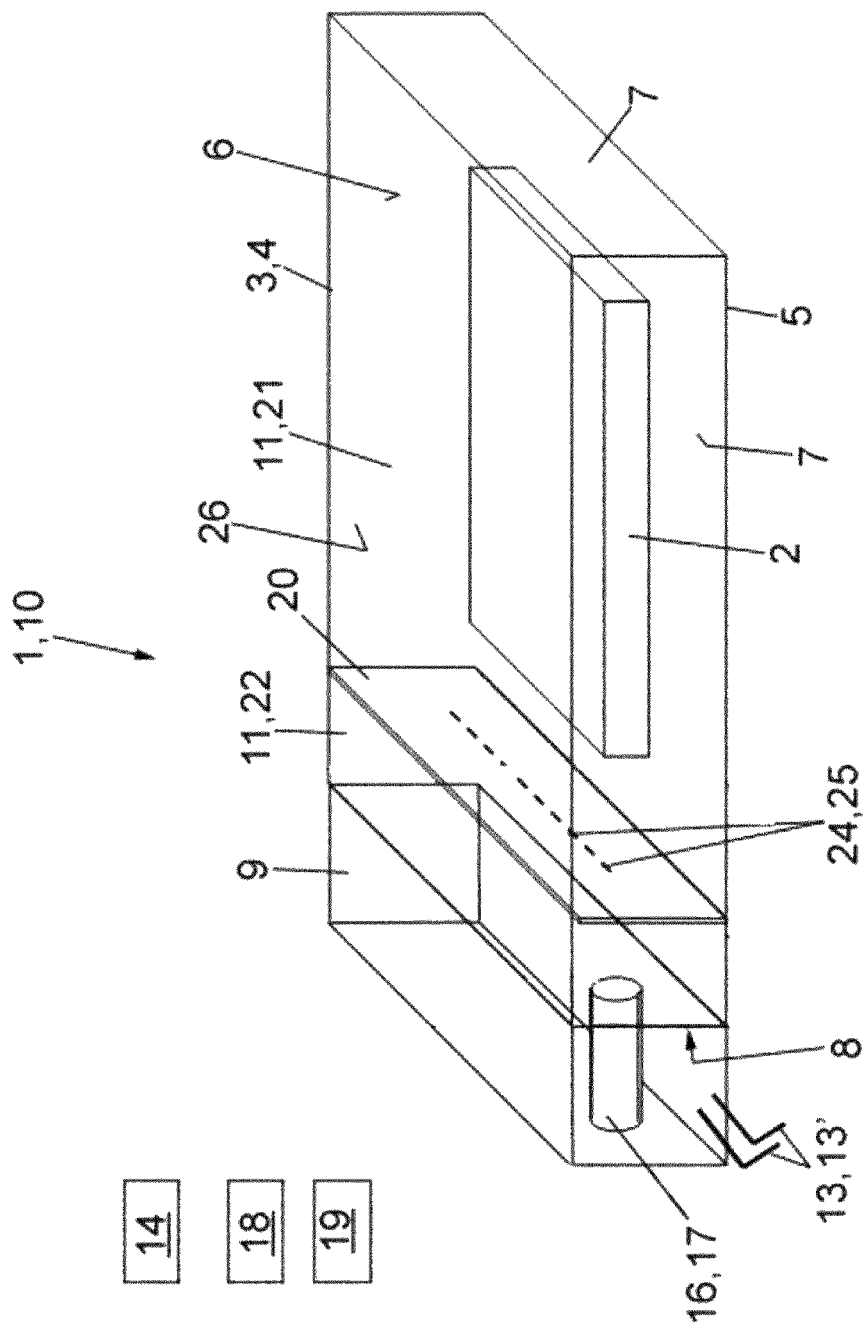
FIG. 2 a perspective view of the process box of FIG. 1 with a front seal.

Reference is made first to FIGS. 1 and 2, in which a generalized sectional view of a process box 1 for processing a coated substrate 2 (FIG. 1), as well as a perspective view of such a process box 1 with a front seal 9 (FIG. 2) is depicted.

The process box 1 serves for processing a substrate 2 coated on one side, for example, for thermal processing of precursor layers for conversion into a compound semiconductor, in particular, a chalcopyrite compound. Although only a single substrate 2 is depicted, the process box 1 could likewise be used for processing two or more substrates 2.

The process box 1 comprises here, for example, a rectangular-solid-shaped housing 3 with a housing wall 4, composed of a bottom wall 5, a top wall 6, and a peripheral side wall 7. The housing wall 4 encloses a gas-tight or evacuable hollow space 11, which is gas-tightly sealable by a removable seal 9. As depicted in FIG. 2, the housing 3 has, for example, a front housing opening 8, which is sealable by a seal 9 mountable like a door, which forms a part of the side wall 7. Generally speaking, the housing opening 8 and the associated seal 9 can be selectively placed on any wall section of the housing wall 4. The bottom wall 5 serves in a central zone as a supporting surface for the substrate 2, with it being likewise possible also to provide corresponding spacers or support elements.

The housing wall 4 of the process box 1 can be made of the same material or from materials different from each other. Typical materials are metal, glass, ceramic, glass ceramic, carbon fiber reinforced carbon materials, or graphite. It is essential here that the top wall 6 and the bottom wall 5 are in each case implemented such that thermal processing of the coated substrate 2 by thermal energy fed in from the outside in the form of electromagnetic thermal radiation is possible. The thermal energy can be fed in an arrangement 10 schematically indicated in FIG. 1 by radiant heaters 12 arranged, for example, in rows above the top wall 6 as well as below the bottom wall 5. For example, the top wall 6 and the bottom wall 5 are made, for this purpose, from a material that is transparent or at least partially transparent to the electromagnetic radiation radiated in, for example, glass ceramic. The top wall 6 and the bottom wall 5 can also be made of such a material only in sections. It is also equally possible that the top wall 6 and the bottom wall 5 are made of a material that is suitable to at least partially, in particular completely, absorb the electromagnetic radiation in order to be heated themselves, for example, graphite. In this case, the top wall 6 and the bottom wall 5 serve as passively heated, secondary heat sources.

As is discernible in FIG. 2, the housing wall 4, here, for example, the seal 9, is provided with two coolant connections 13, 13', which serve as an inlet or an outlet for coolant in a coolant line system (not shown in detail) running through the peripheral side wall 7 at least in sections, in particular completely. By means of the coolant introduced, the side wall 7 can be temperature controlled at least in sections, in particular completely, to a pre-definable temperature, or actively cooled relative to the substrate temperatures during thermal processing. The two coolant connections 13, 13' can be fluidically connected for this purpose to a temperature controlling device or cooling device 14 for preparation and cooling of the coolant. In general, in the process box 1, only those housing sections that do not serve for thermal processing of the coated substrate 2 are temperature controlled or actively cooled, by thermal energy fed in from outside in the form of electromagnetic thermal radiation, here, for example, the peripheral side wall 7 or at least a section thereof. In the present example, only the seal 9 is temperature controlled or cooled. Oil or water, for example, can be used as coolant. The temperature control or active cooling can alternatively also be obtained through contact cooling (heat conduction) through contact with heat sinks (for example, cooling plates), a blower (convection cooling) or without contact by spaced heat sinks (radiative cooling).

The housing 3 further comprises a gas passage 16 provided with a valve 15 that opens into the hollow space 11. Here, the gas passage 16 is arranged, for example, in the front seal 9. The hollow space 11 can be evacuated via a gas connection 17 by connection to a pumping out device 18 (vacuum pump). Also, the gas connection 17 can be connected to a gas supply device 19 in order to purge the hollow space 11 by introduction of an inert purge gas and/or to fill it with a reactive process gas. Filling with the process gas can be done at negative or positive pressure. By means of the valve 15 (for example, a multipath valve), the gas passage 16 can be selectively opened or gas-tightly sealed. The hollow space 11 has a relatively low clear height, for example, in the range from 7 to 12 mm, in order to enable rapid evacuation and efficient filling with process gas.

The hollow space 11 is divided quasi-gas-tight by a strip-shaped separating wall 20 into a process space 21 and an intermediate space 22, with the coated substrate 2 accommodated only in the process space 21. The gas passage 16 opens into the intermediate space 22. The separating wall 20 is provided with one or a plurality of openings or breaks, by means of which the process space 21 is fluidically connected to the intermediate space 22.

As is discernible in the vertical sectional view of FIG. 1, the separating wall 20, which extends vertically from the bottom wall 5 in the direction of the top wall 6, does not reach all the way to the (interior side of the) top wall 6, such that a gap 23 remains as an opening of the separating wall 20. FIG. 2 depicts a variant in which the separating wall 20 extends all the way to the top wall 6 and is provided with a plurality of horizontal slots 24 arranged roughly centrally in a row. Through the gap 23 or the slots 24, the process space 21 is fluidically connected to the intermediate space 22 such that a mutual gas exchange is possible but is inhibited because of the small vertical dimension or height of the gap 23 or slots 24. The separating wall 20 thus acts as a diffusion barrier or a vapor barrier between the process space 21 and the intermediate space 22.

The property of the separating wall 20 to act as a diffusion barrier or a vapor barrier is based on the pressure dependency of free path length: at almost normal pressure (700-1000 mbar), the diffusion is inhibited by the relatively small opening(s) of the separating wall 20. In contrast, when the intermediate space 22 is evacuated to pressures in the pre-vacuum range (10-1000 µbar), the free path length is greatly increased and the separating wall 20 then represents only a weak diffusion barrier for the gas exchange. The process space 21 can thus be pumped out through the separating wall 20 and, after the pumping out, process gas can also flow into the process space 21 via an inlet into the intermediate space 22. On the other hand, by means of the separating wall 20, the partial pressure of readily volatile chalcogen components, such as selenium or sulfur, which diffuse/evaporate out of the coated substrate 2 during thermal processing, can be kept at least largely constant in the process space 21 during thermal processing of the substrate 2. The separating wall 20 thus acts, for example, as a selenium barrier during thermal processing of a substrate 2.

Generally speaking, a (common) opening area 25 of the gap 23 or slots 24 is dimensioned such that, during thermal processing of the substrate 2, a mass loss of a gaseous substance generated by thermal processing of the coated substrate 2 out of the process space 21 is less than 50%, preferably less than 20%, more preferably less than 10%, of the mass of the gaseous substance generated in the process space 21 during thermal processing. For this purpose, the separating wall 20 is implemented such that an area ratio, formed from the opening area 25 divided by an internal surface or inner surface 26 of the process space 21, is in the range from $5 \times 10^{-5}$ to $5 \times 10^{-4}$.

For example, the inner surface 26 of the process space 21 has a size of ca. 1.2 m². A mean gap height of the gap 23 is, for example, in the range from 50 to 100 µm, corresponding to an opening area 25 in the range from 2 to 5 cm². The separating wall 20 has, for example, a height of 9 mm. These values yield an area ratio of $1.5 \times 10^{-4}$.

By means of the separating wall 20 serving as a vapor barrier or diffusion barrier, a diffusion of volatile components developing in the process space 21 during the thermal processing into the intermediate space 22 can at least be largely suppressed such that a condensation of the volatile components on the temperature-controlled (actively cooled)

side wall 7, here, specifically the seal 9, is prevented. The process atmosphere in the process space 21 can thus be kept at least approximately constant.

As illustrated in FIG. 2, the intermediate space 22 is situated at least partially, in particular completely, outside a (common) radiation field of the radiant heaters 12 such that during thermal processing, a temperature gradient is formed in the intermediate space 22 from the separating wall 20 to the temperature-controlled (actively cooled) side wall 7, here, specifically the seal 9. This temperature gradient serves as a "temperature barrier" for protection of vacuum-compatible components of the process box 1 against high thermal stress. For this purpose, the radiant heaters 12 are arranged exclusively above or below the process space 21 in front of or up to the separating wall 20. The radiant heaters 12 end in each case at least a few centimeters in front of the intermediate space 22 or separating wall 20. On the other hand, the radiant heaters 12 are arranged such that a rising temperature gradient is formed such that a desired process temperature for the thermal processing of the coated substrate 2 is obtained starting from the side wall 7, specifically seal 9, to the separating wall 20 in front of or at least at the level of the separating wall 20 in order to ensure an adequate conversion of the precursor layers of the substrate 2 into compound semiconductors.

In the general embodiment illustrated in FIG. 1, the separating wall 20, the intermediate space 22, and the temperature-controllable or coolable section(s) of the side wall 7 can be designed laterally in one direction, in two directions, or peripherally (frame). In the embodiment of FIG. 2, the separating wall 20, the intermediate space 22, and the temperature-controllable or coolable section of the side wall 7 (seal 9) are realized only in one spatial direction.

The substrate 2 is made, for example, of glass with a thickness in the range from 1 mm to 4 mm, in particular 2 mm to 3 mm. The substrate 2 is provided with a layer structure (not shown in detail), which consists, for example, of precursor layers of an absorber (e.g., chalcopyrite compound or kesterite compound), which must be subjected to RTP thermal processing. For example, the layer structure is a sequence of the layers silicon nitride/molybdenum/copper-indium-gallium/selenium. For example, the silicon nitride layer has a thickness in the range from 50 nm to 300 nm; the molybdenum layer, a thickness in the range from 200 nm to 700 nm; the copper-indium-gallium layer, a thickness in the range from 300 nm to 1000 nm; and the selenium layer, a thickness in the range from 500 nm to 2000 nm.

The process box 1 can be assembled simply using automation and loaded or unloaded through the housing opening 8. The separating wall 20 must be moved in each case during opening and closing such that the substrate 2 can be brought into it.

Referring to FIG. 3A-3C, another exemplary embodiment of the process box 1 illustrated generally in FIG. 1 is described with reference to various representations.

Accordingly, the process box 1 comprises a base plate 27, on which, in an edge region, a peripherally closed frame 28 is placed loosely, but sealably. It would be conceivable to fixedly connect the frame 28 to the base plate 27. As can be readily discerned in the vertical sectional representations of FIGS. 3A and 3B, the base plate 27 serves in a central zone as a support for the substrate 2, with it being equally possible to provide corresponding spacers or support elements. A flat cover plate 29 is placed loosely on the frame 28. By removal of the cover plate 29 from the frame 28, the process box 1 can be loaded in a simple manner, in particular using automation, with the coated substrate 2 or the processed substrate 2 can be removed. FIG. 3A depicts the open process box 1 with the cover plate 29 raised; FIG. 3B, the closed process box 1 with the cover plate 29 in place on the frame 28.

In the process box 1, baseplate 27, frame 28, and cover plate 29 are arranged above and below each other in the form of a stack and together enclose the gas-tight or evacuable hollow space 11. The hollow space 11 is divided quasi-gas-tight by the strip-shaped separating wall 20 implemented peripherally closed in correspondence with the frame 28 into the (inner) process space 21 and the peripheral (outer) intermediate space 22. The intermediate space 22 surrounds the process space 21. Analogously to FIG. 1, the strip-shaped separating wall 20 extends vertically from the baseplate 27 in the direction toward the cover plate 29, wherein a narrow gap 23 remains between the separating wall 20 and the cover plate 29. By means of the gap 23, the process space 21 is fluidically connected to the intermediate space 22 such that a mutual gas exchange is possible, with the separating wall 20, however, acting as a diffusion barrier or vapor barrier. Reference is made to the statements concerning this with regard to FIG. 1.

As is discernible in FIG. 3C, the gas passage 16 provided with the valve 15 opens through the frame 28 into the intermediate space 22, in order to evacuate the hollow space 11, to purge it with an inert purge gas (e.g., $N_2$), and to fill it with a process gas. The process gas introduced through the gas passage 16 can, for example, contain reactive gases, such as $H_2S$, $H_2Se$, S vapor, Se vapor, or $H_2$ as well as inert gases such as $N_2$, He, or Ar.

As is further discernible in FIG. 3C, the frame 28 is provided with the two coolant connections 13, 13', which serve as an inlet or an outlet for coolant in a coolant line system (not shown in detail) extensively running through the frame 28. By means of the coolant introduced into the frame 28, the frame 28 can be temperature controlled (actively cooled) during and, if desired, after thermal processing of the substrate 2. The two coolant connections 13, 13' are fluidically connected for this purpose to the cooling device 14 for the preparation and cooling of the coolant. The frame 28 is preferably made of a material with high thermal conductivity, for example, a metal material, in particular, stainless steel.

The baseplate 27 and the cover plate 29 are in each case implemented such that thermal processing of the coated substrate 2 by thermal energy fed above or below the process box 1 in the form of electromagnetic thermal radiation is possible. Reference is made to the statements concerning this with regard to FIG. 1. For this purpose, the baseplate 27 and the cover plate 29 are made, for example, of glass ceramic.

Through the separating wall 20 serving as a vapor barrier or a diffusion barrier, diffusion of volatile components developing in the process space 21 during thermal processing can be, at least largely suppressed such that condensation of the volatile components on the temperature-controlled (actively cooled) frame 28 is prevented. The process atmosphere in the process space 21 can thus be kept at least approximately constant.

Figure 4:
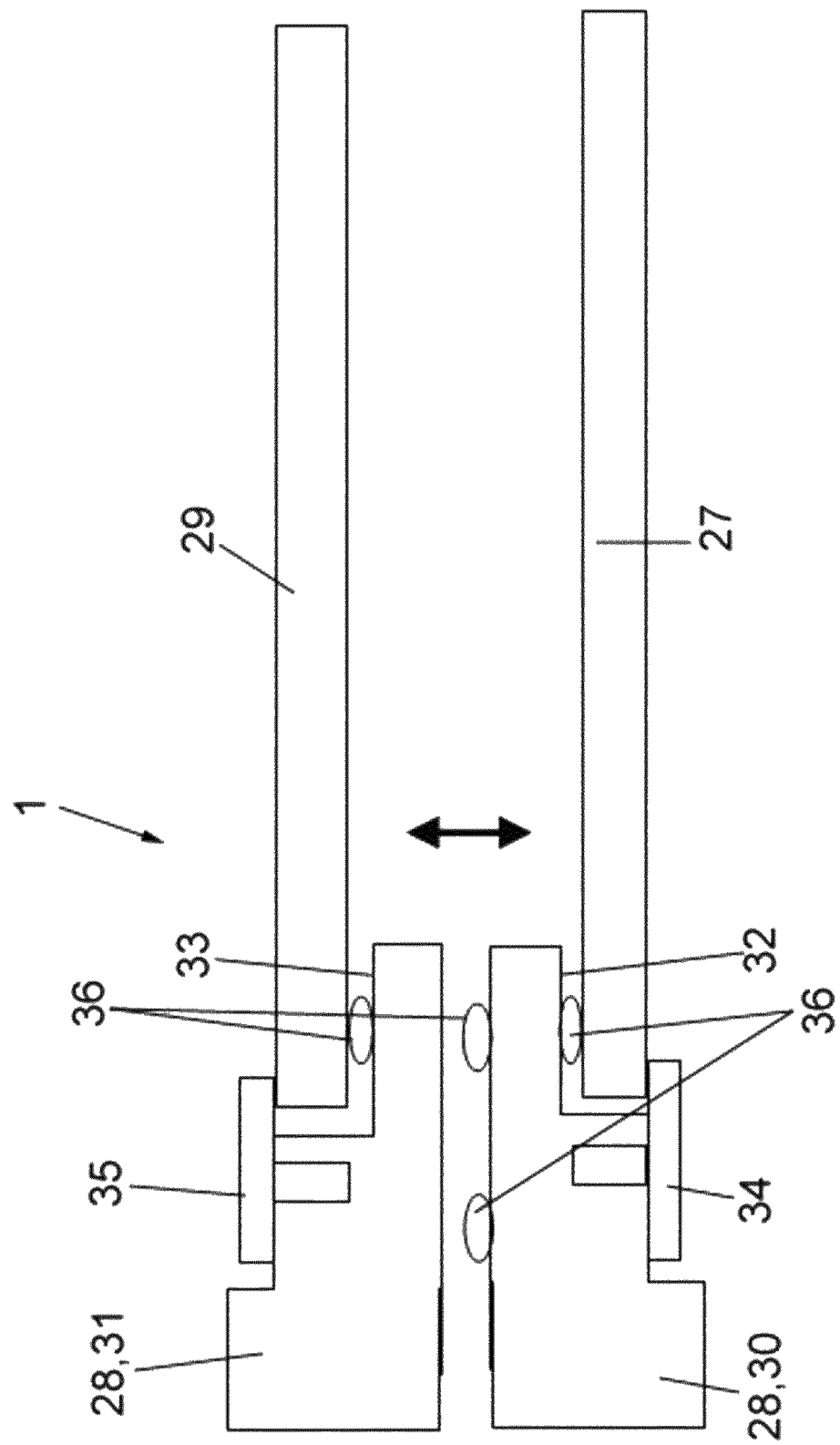
FIG. 4 a variant of the process box of FIG. 3A-3C with two joinable frame parts.

FIG. 4 depicts a variant of the process box 1 of FIG. 3A-3C. To avoid unnecessary repetitions, only the differences relative to FIG. 3A-3C are depicted and, otherwise, reference is made to the statements concerning this. Accordingly, the process box 1 differs in that the frame 28 consists of two frame parts 30, 31 that can be gas-tightly joined to each other. Thus, a lower, first frame part 30 is provided, which has a first bearing surface 32, against which the baseplate 27 is clamped for fixed connection by a first clamping member 34. Analogously, an upper, second frame part 31 is provided, which has a second bearing surface 33, against which the cover plate 29 is clamped for fixed connection by a second clamping member 35. As indicated by the double arrow, the second frame part 31 can be lifted from the first frame part 30, in order to load the process box 1 with the substrate 2 or to remove the processed substrate 2. On the other hand, the two frame parts 30, 31 can be gas-tightly joined, with the required gas-tightness ensured by sealing members 36. The process box 1 is distinguished by especially simple automatable loadability and unloadability.

Reference is now made to FIG. 5A-5F, in which different variants of the separating wall 20 of the process box 1 are illustrated. This is in each case a temperature-controlled separating wall 20, which is, for this purpose, made of a material that has a coefficient of thermal expansion such that a total opening area 25 of the respective openings or breaks is reduced by heating the separating wall 20 during thermal processing to a maximum of 50%, preferably a maximum of 30%, more preferably a maximum of 10%, of the starting value (total opening area 25 before thermal processing). The separating wall 20 is made, for this purpose, of a material with a coefficient of thermal expansion of more than $5 \times 10^{-6}$ $K^{-1}$. Examples for this are certain glass ceramics with a coefficient of thermal expansion of $9 \times 10^{-6}$ $K^{-1}$, aluminum oxide ($Al_2O_3$) with a coefficient of thermal expansion in the range from $6.5 \times 10^{-6}$ $K^{-1}$ to $9 \times 10^{-6}$ $K^{-1}$, zirconium oxide and magnesium oxide with a coefficient of thermal expansion in the range from $10 \times 10^{-6}$ $K^{-1}$ to $13 \times 10^{-6}$ $K^{-1}$. The material of the separating wall 20 must also be temperature resistant and corrosion resistant.

Figure 5A:
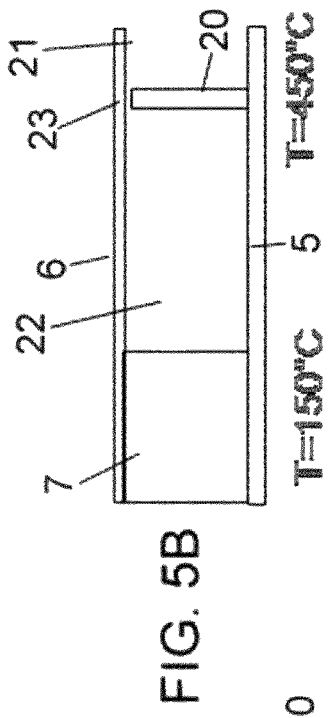
FIG. 5A-5F different variants of a temperature-controlled separating wall of the process box.
Figure 5B:
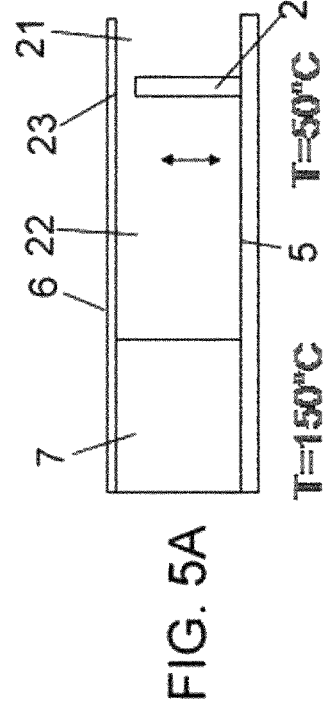

FIGS. 5A and 5B depict the separating wall 20 of the process box 1 implemented as a vertical strip, in each case in a vertical sectional representation. Accordingly, the separating wall 20 does not extend all the way to the top wall 6 or the cover plate 29 such that the gap 23 remains as an opening for the fluidic connection of the process space 21 and the intermediate space 22. FIG. 5A depicts a situation in which the side wall 7 or the frame 28 is temperature controlled to a temperature of T=150° C., whereas the separating wall 20 has a temperature of T=50° C. The material of the separating wall 20 is relatively cold; the gap 23 is wide open. The vertical dimension or mean gap height (clear width) of the gap 23 is in the range from 50 to 100 μm with a height of the separating wall 20 of ca. 10 mm. During heating, the material of the separating wall 20 expands relatively dramatically, with the mean gap height decreasing (FIG. 5B). For example, with heating of the separating wall 20 to a temperature of T=450° C. (temperature difference 400° C.), a change in the vertical dimension of the separating wall 20 of ca. 40 μm is attained such that the mean gap height of the gap 23 decreases to a value in the range from 10 to 50 μm, i.e., a maximum of 50% of the starting value.

Figure 5C:
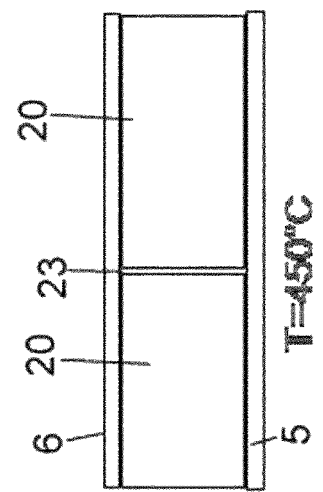
Figure 5D:
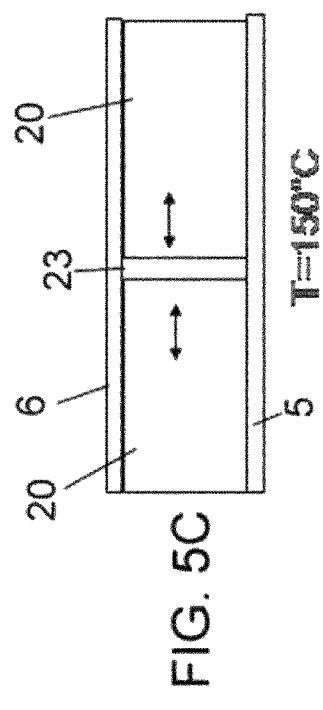

FIGS. 5C and 5D depict a variant with reference to a view of the separating wall 20. To avoid unnecessary repetitions, only the differences relative to FIGS. 5A and 5B are explained, and, otherwise, reference is made to the statements there. Accordingly, the strip-shaped separating wall 20 extends from the bottom wall 5 or the baseplate 27 to the top wall 6 or the cover plate 29, with one or a plurality of vertical gaps 23 implemented in the form of breaks of the separating wall 20. The gap width measured in the horizontal direction is in the range from 50 to 100 μm (FIG. 5C). By means of a dimensioning of the separating wall regions between two gaps 23 greater compared to the height of 10 m, relatively greater travel, which can, for example, amount to several 100 μm, can be obtained with heating of the separating wall 20 to a temperature of, for example, T=450° C. In particular, the total opening area of the gaps 23 can be reduced to, for example, a maximum of 50% of the starting value.

Figure 5E:
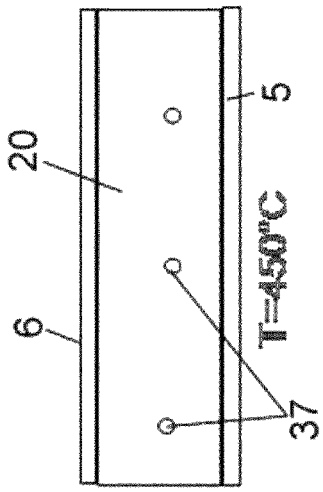
Figure 5F:
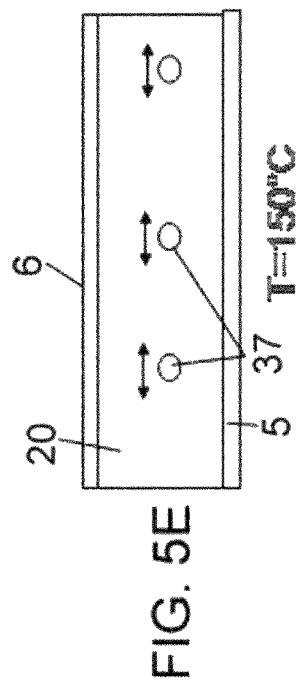

FIGS. 5E and 5F depict another variant with reference to a view of the separating wall 20. To avoid unnecessary repetitions, again only the differences relative to FIGS. 5A and 5B are explained, and, otherwise, reference is made to the statements there. Accordingly, a plurality of round holes 37 are provided instead of a gap 23, which are in each case implemented in the form of perforations of the separating wall 20. Starting from a situation in which the temperature of the separating wall 20 is, for example, T=150° C. (FIG. 5E), a reduction of the diameter of the opening of the round holes 37 can be obtained by means of heating the separating wall 20 to a temperature of, for example, T=450° C. (FIG. 5F). In particular, the entire opening area of the round holes 37 can be reduced to, for example, a maximum of 50% of the starting value.

Figure 6:
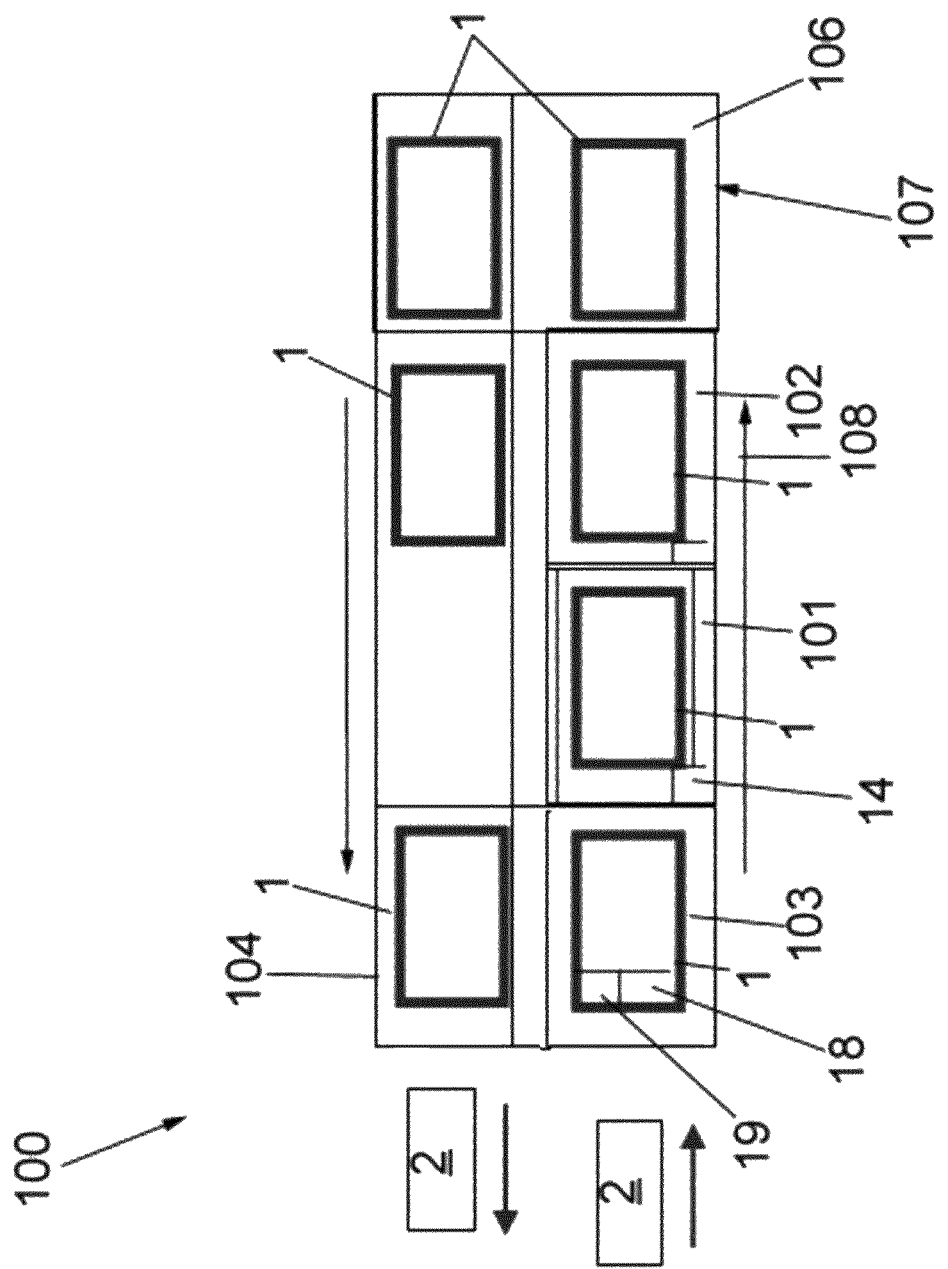
FIG. 6-9 using schematic views, various exemplary embodiments of the system according to the invention for processing substrates in process boxes.

Reference is now made to FIG. 6, in which an exemplary embodiment for a system 100 for processing coated substrates 2 in process boxes 1 in accordance with FIG. 1 to FIG. 5A-5F is illustrated with reference to a schematic view. The system 100 is designed for RTP thermal processing of coated substrates 2 for production of thin-film solar modules. The substrates 2 are in each case coated with precursor layers of a compound semiconductor serving as an absorber, in particular of the type chalcopyrite compound or kesterite compound.

Accordingly, the system 100 comprises various units 101-104 for processing the coated substratee 2 in process boxes 1, which are arranged successively here as an in-line system. The various units 101-104 are not implemented as evacuable process chambers, but rather arranged as functionally and structurally individualizable process units in a common system chamber 106, which is delimited by a system housing 107. The units 101-104 can in each case be arranged open in the system chamber 106 or, however, surrounded by a separate device housing, which is, however, not evacuable. Advantageously, the housing of each unit is connected to exhaust ventilation. It is essential here that in the system 100 the process boxes 1 are exclusively used as evacuable system components. Since with the exception of the process boxes 1, the system 100 is free of evacuable components, its technical implementation is substantially simplified compared to conventional in-line systems for RTP thermal processing of coated substrates and the investment costs of the system 100 are significantly lower.

As illustrated in FIG. 6, the system 100 comprises a serial arrangement of units 101-104, consisting of a loading unit 103, a heating unit 101, a cooling unit 102, and an unloading unit 104, which are arranged in this sequence along a circulating (closed) transport route for process boxes 1.

The loading unit 103 is used for automated loading of a process box 1 with a coated substrate 2. For this purpose, the loading unit 103 has a logic or program controlled gripping member to open and close the process box 1, which also serves for the handling of the coated substrate 2 for introduction into the process box 1. A separate gripping member can also be provided for the handling of the substrate 2. In addition, integrated into the loading unit 103 is a pumping-out device 18 for the evacuation of the hollow space 11 of a process box 1 as well as a gas supply device 19 (gas feed) for supplying the process box 1 with a purge gas and/or a process gas, which can in each case be connected to the gas connection 17 of the process box 1.

The heating unit 101 is used for heating and thermal processing of a substrate 2 introduced into a process box 1 for conversion of the precursor layers to the compound semiconductor. It has, for this purpose, a plurality of radiant heaters 12, which are, for example, arranged in two rows above and below a process box 1. A corresponding arrangement of radiant heaters 12 is illustrated in FIG. 3B. In addition, integrated into the heating unit 101 is a temperature-controlling or cooling device 14 for the temperature control or active cooling of a housing section of the process box 1 during thermal processing of the substrate 2.

The cooling unit 102 is used for the active cooling of a hot substrate 2 after its thermal processing and is implemented for this purpose to enable contact cooling (heat conduction) through heat sinks positioned at the process box 1, for example, cooling plates, and/or cooling by a blower (convection cooling), for example, by a circulating stream of air, argon, or nitrogen, and/or contact-free cooling by heat sinks arranged above and/or below the process box 1 (radiative cooling), for example.

The unloading unit 104 is used for the automated removal of a processed substrate 2 from a process box 1. For this, the unloading unit 104 has by analogy with the loading unit 103 a logic or program controlled gripping member to open and close the process box 1.

In the system 100 of FIG. 6, coated substrates 2 can be processed in multiple process boxes 1 at the same time and successively fed to the various units 101-104, wherein, for this purpose, a unidirectional transport mechanism 108 (not shown in detail) is provided for the transport of the process boxes 1 along the transport route. Transport of the process boxes 1 can take place, for example, on driven transport rollers (e.g., stub rollers), which support the process boxes 1 on their bottom surfaces. The transport speed outside the units 101-104 is, for example, as much as 1 m/s.

The operation of the system 100 is demonstrated by a concrete example in which, merely for the sake of simpler description of the procedures, reference is made to the geometric arrangement of the units 101-104 in FIG. 6.

First, a coated substrate 2 is driven to the loading unit 103, in which a process box 1 is loaded with the substrate 2. The process box 1 is opened with the help of the gripping member, the substrate 2 is placed in the process box 1, and the process box 1 is then closed again. In addition, the hollow space 11 of the loaded process box 1 is pumped out or evacuated by operation of the pumping-out device 18, in order to remove oxygen and water from the hollow space 11. For this purpose, the pumping-out device 18 is automatically connected to the gas connection 17 of the process box 1. The gas connection 17 is then connected to the gas supply device 19 and the loaded hollow space 11 is purged with an inert purge gas (e.g., $N_2$, He, or Ar). The pumping out procedure and the purge procedure can optionally be repeated several times. Next, the hollow space 11 of the process box 1 is filled with a process gas (e.g., reactive gases such as $H_2S$, $H_2Se$, S vapor, Se vapor as well as inert gases such as $N_2$, He, or Ar). For example, $H_2S$ is filled in (up to 200-400 mbar) as a process gas. The process box 1 can be filled at negative or positive pressure.

The pumping-out device 19 and the gas supply device 18 can also be connected together to the gas connection 17, for example, by a multipath valve 15. The process box 1 is now prepared for thermal processing of the coated substrate 2.

After disconnecting the pumping-out device 19 and the gas supply device 18 from the process box 1, the process box 1 is transported from the loading unit 103 to the heating unit 101 and the two coolant connections 13, 13' of the process box 1 are connected to the cooling device 14. Then, RTP thermal processing of the precursor layers is performed, Wherein the coated substrate 2 is heated, for example, at a heating rate of 1° C./s to 50° C./s to a temperature of, for example, 350° C. to 800° C., in particular 400° C. to 600° C., by the radiant heaters 12. For example, precursor layers of copper, indium, gallium, and selenium are converted in a sulfur-containing and/or selenium-containing atmosphere into a semiconductor layer of the compound $Cu(In,Ga)(S,Se)_2$. For example, selenization and sulfurization are done at a pressure in the process box 1 of less than 800 mbar in pure $H_2S$.

During thermal processing by means of the heating unit 101, the frame 28 of the process box 1 is temperature controlled by a circulating coolant to a temperature of, for example, 150° C. or cooled. After thermal processing, the cooling device 14 is disconnected from the process box 1. Alternatively, contact cooling with heat sinks by thermal conduction, radiative cooling with heat sinks or convection cooling for the temperature control or cooling of the frame 28 would, for example, also be possible.

Then, the process box 1 is transported from the heating unit 101 to the cooling unit 102 and the hot substrate 2 is cooled by the cooling unit 102. The hot substrate 2 is, for example, cooled at up to 50° C./s to a temperature necessary from a process engineering standpoint, for example, 10° C. to 380° C. In addition, cooling by circulating coolant, which is introduced and discharged respectively at the two coolant connections 13, 13', can be provided. The accordingly equipped cooling unit 102 is connected for this purpose to the two coolant connections 13, 13'.

When the substrate 2 has reached the desired temperature, the process box 1 is transported from the cooling unit 102 to the unloading unit 104, in which the process box 1 is opened and the process substrate 2 is removed by the gripping member such that it can be delivered to further processing for producing the thin-film solar module. The process box 1 is then closed again and guided along the transport route of the loading unit 103, from which it can again be loaded with a substrate 2 to be processed. The loading or unloading of process boxes 1 circulate cyclically on the transport route.

The in-line system 100 illustrated with reference to FIG. 6 can be loaded batch-wise, wherein the process boxes 1 loaded in the various units 101-104 can be processed simultaneously. In particular, a hot substrate 2 can be actively cooled in the cooling unit 102, while another substrate 2 is subjected to RTP thermal processing in the heating unit 101. Process boxes 1 can be loaded or unloaded simultaneously in the loading unit 103 and unloading unit 104. The process boxes 1 can be conveyed in each case from one unit to the next in accordance with a predetermined cycle time.

Although this is not depicted in FIG. 6, the system 100 can equally have a plurality of heating units 101 and/or a plurality of cooling units 102 and/or one or plurality of cooling lines.

In the system 100, it is, in principle, possible, through the use of the evacuable process boxes 1 and (in contrast to the conventional in-line systems) the lack of need to evacuate the units 101-104 or to provide them with a controlled process atmosphere, to keep the process boxes 1 stationary and, in each case, to move only the respective units, i.e., loading unit 103, unloading unit 104, heating unit 101, and cooling unit 102 relative to the stationary process boxes 1. It would thus be conceivable for a stationary process box 1, to be opened by the loading unit 103 brought into position, loaded with a coated substrate 2, and then closed again. After evacuating, purging, and filling the hollow space 11 of the process box 1 with the process gas and removal of the loading unit 101, the radiant heaters 12 of the heating unit 101 are brought into position and thermal processing of the coated substrate 2 is performed. Then, the radiant heaters 12 are moved away and the cooling unit 102 is brought into position in order to cool the hot substrate 2. Finally, the cooling unit 102 is moved away and the loaded process box 1 is opened by the unloading unit 104 and the process substrate 2 is removed from the process box 1. For this, the various units 101-104 can, for example, be moved together (synchronously) by the transport mechanism 108 along the circulating process line. However, separate movement of the various units 101-104 would also be possible. Simultaneous processing of a plurality of substrates 2 in a plurality of stationary process boxes 1 is possible in a simple manner. The pumping-out device 18, the gas supply device 19, and the cooling device 14 can in each case remain permanently connected to the stationary process boxes 1.

The system 100 for processing coated substrates 2 thus differs fundamentally from conventional in-line systems for RTP thermal processing of coded substrates, since the various units 101-104 need not be realized as evacuable process chambers. In addition, the system 100 needs no evacuable input and output locks and there are no moving components in the vacuum compatible region of the system 100 such that system components such as radiant heaters, transport rollers, and other components can be realized cost-effectively and are readily accessible. The process boxes 1 are the only vacuum-compatible components. In the event of failure and leakage of a process box 1, only one individual process box 1 has to be exchanged and the system 100 can be operated again. The thermal processing of substrates 2 in stationary process boxes 1 is possible without problems.

Figure 7:
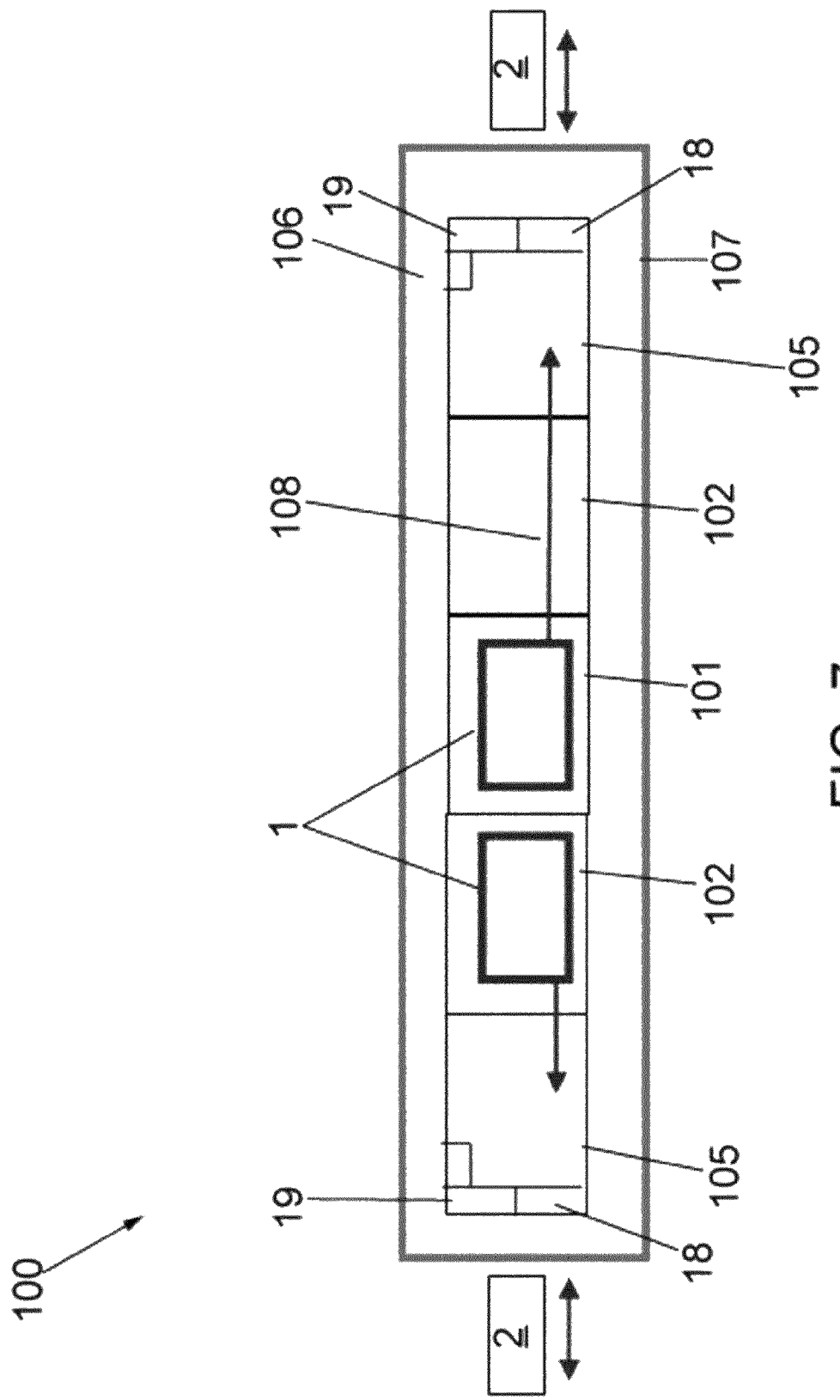

Referring to FIG. 7, another exemplary embodiment for a system 100 for processing substrates in process boxes in accordance with FIG. 1 to FIG. 5A-5F is described using a schematic view. To avoid unnecessary repetitions, only the differences relative to system 100 of FIG. 6 are explained and, otherwise, reference is made to the statements there.

Accordingly, the system 100 comprises a serial arrangement of units, consisting of one heating unit 101, two cooling units 102, which are situated on both sides of the heating unit 101, and two loading/unloading units 105, between which the other units 101, 102 are situated.

The loading/unloading units 105 are constructed identical to each other and are used in each case for the automated loading of a process box 1 with a coated substrate 2 as well as for the automated removal of thermally processed substrate 2 from the process box 1, for which purpose a gripping member is provided. Also, the loading/unloading units 105 have in each case the pumping-out device 18 for evacuating the hollow space 11 of a process box 1 as well as the gas supply device 19 for introduction of purge gas and/or a process gas in the process box 1, which can in each case be connected to the gas connection 17 of the process box 1. The heating and cooling unit 101, 102 are constructed as in the system 100 of FIG. 6.

In the system 100 of FIG. 7, coated substrates 2 in two transportable process boxes 1 can be processed simultaneously and can be successively fed into the process boxes 1 of the different units, wherein for this purpose a bidirectional transport mechanism 108 (not shown in detail) is provided.

The operation of the system 100 is demonstrated by a concrete example, in which, merely for the sake of simpler description of the procedures, reference is made to the geometric arrangement of the units 101, 102, 105.

First, a first substrate 2 is driven to the right loading/unloading unit 105, where a first process box 1 is loaded with the substrate 2 and, then, the hollow space 11 of the process box 1 is evacuated, purged with a purge gas, and filled with a process gas. Then, the first process box 1 is transported to the heating unit 101 and RTP thermal processing is performed. After completion of the RTP thermal processing, the first process box 1 is transported to the right cooling unit 102 in order to cool the hot first substrate 2 by means of the cooling unit 102.

Still during thermal processing of the first substrate 2 by the heating unit 101, a second substrate 2 is transported to the left loading/unloading unit 105 and loaded in a second process box 1, wherein the loaded hollow space 11 of the second process box 1 is evacuated, purged with purge gas, and filled with a process gas. Following the transport of the first process box 1 from the heating unit 101 to the right cooling unit 102, the second process box 1 is driven to the heating unit 101 and the second substrate 2 is subjected to thermal processing.

Still during thermal processing of the second substrate 2, the cooled first substrate 2 is transported to the right loading/unloading unit 105 and is removed from the first process box. Then, the first process box 1 is loaded by the right loading/unloading unit 105 with another substrate 2 and the process box is prepared by evacuating, purging with purge gas, and filling with a process gas for thermal processing.

When thermal processing of the second substrate 2 situated in the heating unit 101 is completed, the second process box is transported to the left cooling unit 102 and the hot second substrate 2 is cooled. Following that, the first process box 1 with the other substrate is driven into heating unit 101 for its thermal processing.

In the system 100 of FIG. 7, the two process boxes 1 are thus moved back and forth between the heating unit 101 and the left loading/unloading unit 105 or the right loading/unloading unit 101. The process boxes 1 travel in each case only relatively short transport patents such that the possibility exists that the pumping-out device 18, the gas supply device 19, and the cooling device 14 remain permanently connected to the two process boxes 1, for example, by flexible lines (e.g., hose lines).

In the system 100 of FIG. 7, two coated substrates 2 can thus be processed at the same time whereby the possibility exists, due to the two loading/unloading units 105 and the two cooling units 102, of subjecting a substrate 2 to thermal processing by the heating unit 101, while another substrate 2 is cooled by one of the two cooling units 102 after its thermal processing. Since the length of time for the cooling of a hot substrate 2 is typically longer than the length of time for its thermal processing, the period of use of the heating unit 101 can be high, compared to the case in which the heating unit 101 is dedicated to only a single cooling unit 102. By means of the more intensive utilization of the heating unit 101, the throughput of processed substrates 2 can be increased and the production costs per thin-film solar cell module can be reduced.

Since the units 101, 102, 105, in contrast to an in-line system, are not traversed unidirectionally by the process boxes 1, it would also be possible to arrange the units 101, 102, 105, for example, offset relative to each other or in a star formation, instead of in a row.

The possibility already described for the system 100 of FIG. 6, of processing the substrates 2 in each case in stationary process boxes 1, can be realized particularly simply with the system 100 of FIG. 7, since it is merely necessary to move the respective units 101, 102, 105 back and forth with relatively short transport routes with respect to the stationary process boxes 1. Transport of the units 101, 102, 105 could, for example, be done together (synchronously), wherein the right loading/unloading unit 105 is shifted to the right by one position with a common movement of the units 101, 102, 105, and the left loading/unloading unit 105 is shifted to the left by one position with a common movement of the units 101, 102, 105. It is also possible to transport the units 101, 102, 105 in, for example, two working levels above the process boxes 1. In this case, the right loading/unloading unit 105 could, for example, be driven upward after loading of the right process box 1 in order to bring the heating unit 101 into position with the process box 1. Similarly, the heating unit 101 would have to be driven away over the right cooling unit, which can take place similarly by switching into the upper working level. This also applies analogously to the left loading/unloading unit 105 and the lift cooling unit 102.

Concretely, a first substrate 2 could be loaded, for example, by the right loading/unloading unit 105 into the first process box 1 and, then, the right loading/unloading unit 105 could be driven upward into a second working level to deliver the heating unit 101 2 the first process box 1. During thermal processing of the first substrate 2, a second substrate 2 is loaded by the left loading/unloading unit 105 into a second process box 1. Then, the heating unit 101 is driven from the first process box 1 to the second process box 1, in order to thermally process the second substrate 2. Then, the first cooling unit 102 is driven to the first process box 1, in order to cool the first substrate 2, followed by delivery of the right loading/unloading unit 105 for removal of the first substrate 2 from the first process box 1. Analogously, after thermal processing, the second cooling unit 102 is driven to the second process box 1, in order to cool the second substrate 2, followed by delivery of the left loading/unloading unit 105 for removal of the second substrate 2 from the second process box 1.

It is understood that in a plant for producing thin-film solar modules, a large number of such systems 100 can be operated in parallel, for example, in an arrangement in which the systems 100 are arranged next to one another in stacks.

Figure 8:
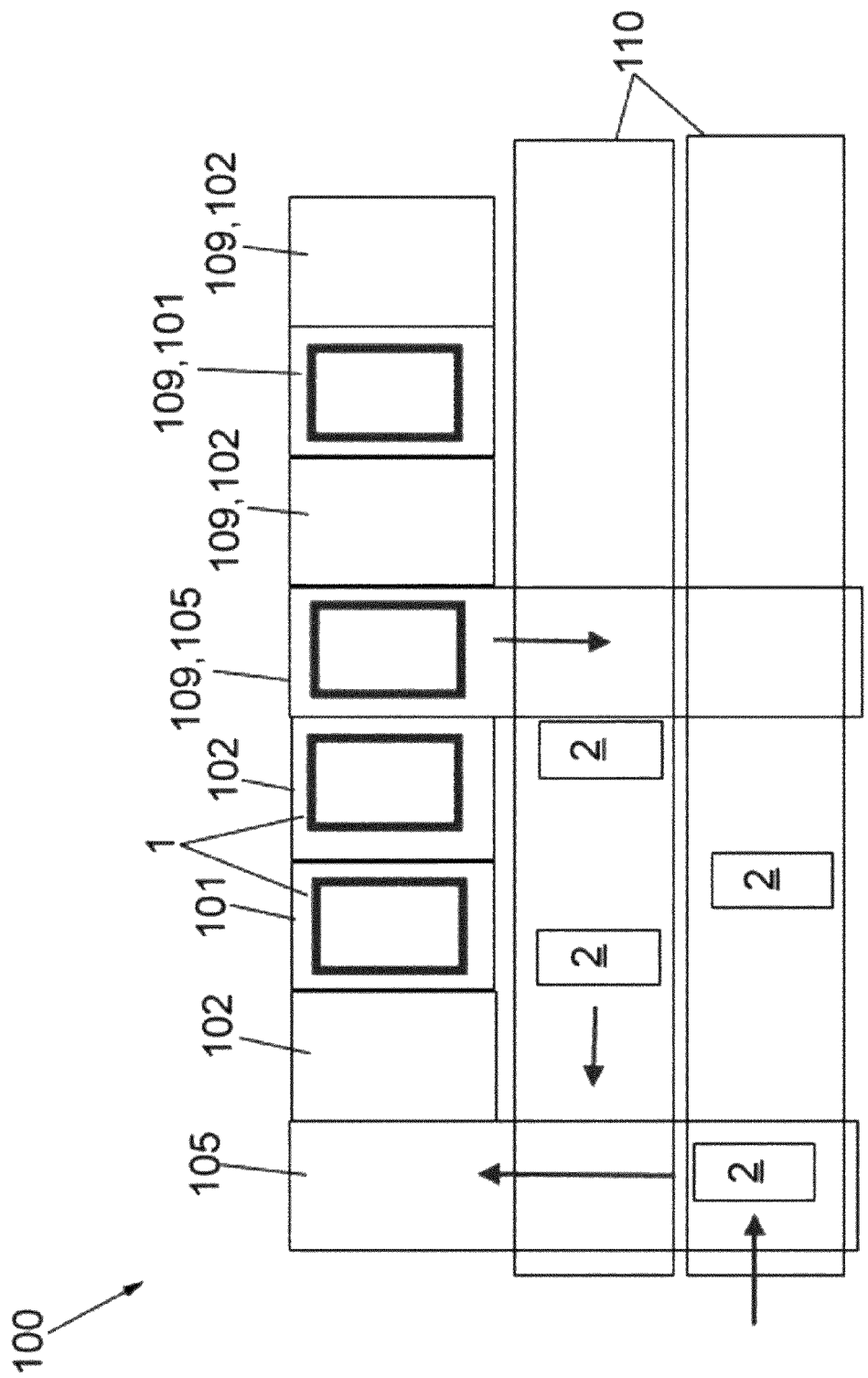

Referring to FIG. 8, another exemplary embodiment for a system 100 for processing substrates in process boxes in accordance with FIG. 1 to FIG. 5A-5F is described using a schematic view. To avoid unnecessary repetitions, again, only the differences relative to system 100 of FIG. 6 are explained and, otherwise, reference is made to the statements there.

Accordingly, the system 100 comprises a serial arrangement of groups 109 or sequences of units, which consist in each case of one cooling unit 102, one heating unit 101, one cooling unit 102, as well as one loading/unloading unit 105. Thus, the system 100 can be comprehended as a serial arrangement of a plurality of systems 100 of FIG. 7. The loading/unloading units 105 are constructed as in the system 100 of FIG. 7. A substrate feed occurs only on one side by means of two transport lines 110 running parallel to the process line, wherein one transport line 110 serves for the inbound transport of the substrates 2 to be processed; the other transport line 110, for the outbound transport of the processed substrates 2. The substrates 2 are fed to the loading/unloading units 105 or are removed from them in each case transverse to the process line. It is essential in the system 100 of FIG. 8 that each loading/unloading unit 105 is functionally dedicated to the heating and cooling unit 101, 102 adjacent on both sides. For the rest, the cycles for processing the substrates 2 correspond to those as they have already been described in connection with FIG. 7. Reference is made in this regard to the statements there.

Figure 9:
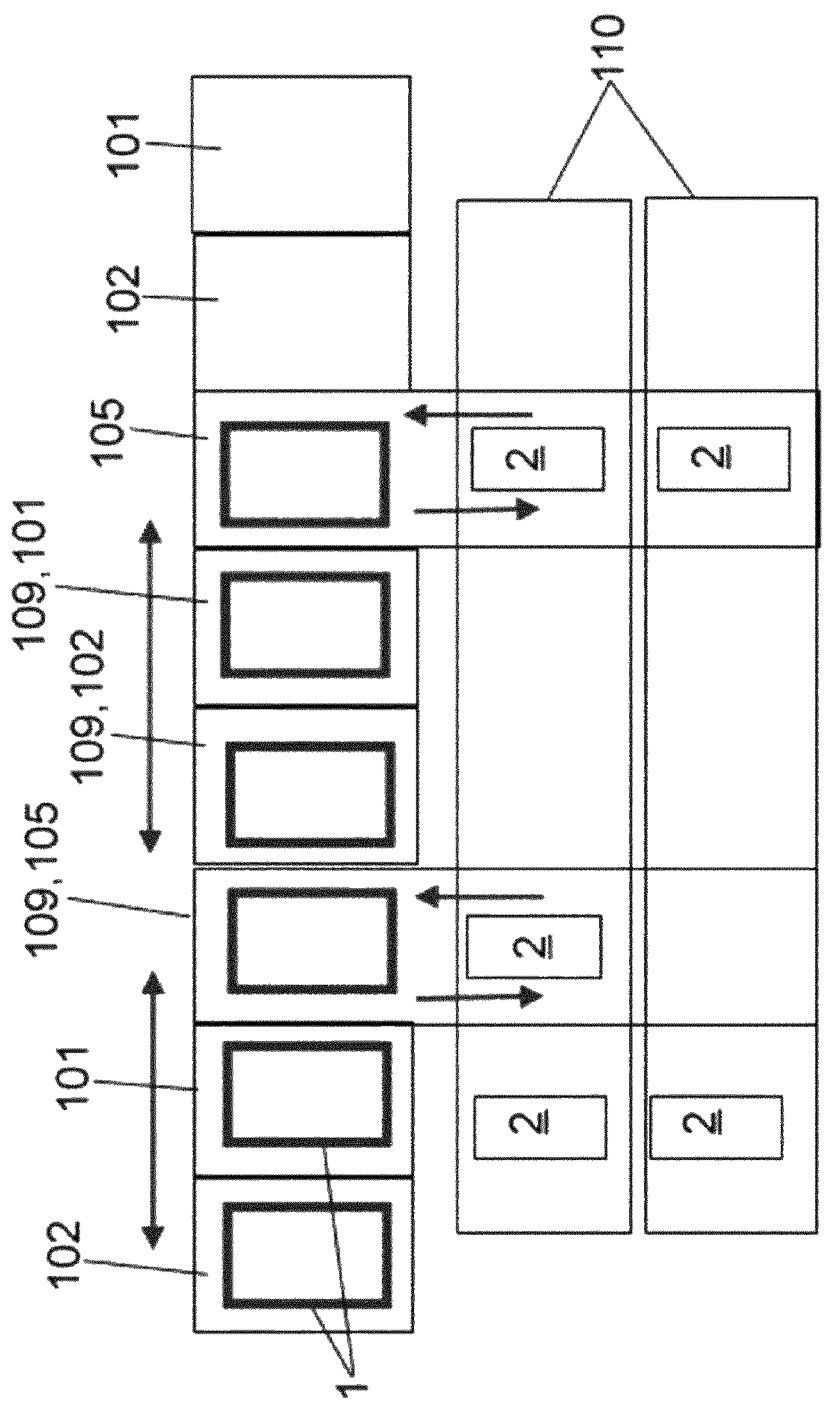

Referring to FIG. 9, another exemplary embodiment for a system 100 for processing substrates 2 in process boxes in accordance with FIG. 1 to FIG. 5A-5F is described using a schematic view. To avoid unnecessary repetitions, again, only the differences relative to system 100 of FIG. 6 are explained and, otherwise, reference is made to the statements there.

Accordingly, the system 100 comprises a serial arrangement of groups 109 or sequences of units, which consist in each case of one cooling unit 102, one heating unit 101, and one loading/unloading unit 105. The loading/unloading units 105 are constructed as in the system 100 of FIG. 7. Each loading/unloading unit 105 is functionally dedicated only to the adjacent heating and cooling unit 101, 102 on one side, in this case, for example, the two left units. A substrate feed occurs only on one side by means of two transport lines 110, wherein one transport line 110 serves for the inbound transport of the substrates 2 to be processed; the other transport line 110, for the outbound transport of the processed substrates 2. The substrates 2 are fed to the loading/unloading units 105 or are removed from them in each case transverse to the process line.

In the system 100 of FIG. 9, the heating and cooling phases must be precisely coordinated since, for example, the process boxes 1 are moved back and forth synchronously relative to the stationary process units 101, 102, 109. In a first step, the loaded process boxes 1 situated in the loading/unloading units 105 are synchronously transported by one position to the left to the heating units 101. (It would also be possible alternatively for the process boxes 1 to be shifted synchronously by two positions to the right.) After thermal processing, all process boxes 1 are synchronously transported in a second step by one more position to the left to the cooling unit 102. (It would also be possible alternatively for the process boxes 1 to be shifted synchronously by two positions to the right.) After cooling of the hot substrates 2, all process boxes 1 are synchronously transported in a third step by two positions to the right to the loading/unloading units 105. (It would also be possible alternatively for the process boxes 1 to be shifted synchronously by one position to the left.) Here, an unloading of process boxes 1 occurs and the cycle (3/3-strike) can start again from the beginning.

The capability of processing the substrates 2 in each case in stationary process boxes 1, can be realized particularly simply with the system system 100 of FIG. 9, since it is only necessary to move the respective units 101, 102, 105 with relatively short transport paths relative to the stationary process boxes 1 synchronously (together) in 3/3-time. The pumping-out devices 18, the gas supply devices 19, and the cooling devices 14 can in each case remain permanently connected to the respective process boxes 1, for example, via flexible hose connections.

LIST OF REFERENCE CHARACTERS 1 process box
2 substrate
3 housing
4 housing wall
5 bottom wall
6 top wall
7 side wall 8 housing opening
9 seal
10 arrangement
11 hollow space
12 radiant heater
13, 13' coolant connection
14 cooling device
15 valve
16 gas passage
17 gas connection
18 pumping-out device
19 gas supply device
20 separating wall
21 process space
22 intermediate space
23 gap
24 slot
25 opening area
26 inner surface
27 baseplate
28 frame
29 cover plate
30 first frame part
31 second frame part
32 first bearing surface
33 second bearing surface
34 first clamping member
35 second clamping member
36 sealing member
37 round hole
100 system
101 heating unit
102 cooling unit
103 loading unit
104 unloading unit
105 loading/unloading unit
106 system chamber
107 system housing
108 transport mechanism
109 group
110 transport line

The invention claimed is:

1. System for processing coated substrates, comprising:
at least one evacuable process box for accommodating at least one substrate, with a gas-tightly sealable housing, which forms a hollow space, wherein the housing comprises at least one first housing section couplable to a cooling device for its cooling and at least one second housing section, different from the first housing section, which is implemented such that the substrate is thermally treatable by incident electromagnetic thermal radiation, wherein the hollow space is divided by at least one separating wall into a process space for accommodating the substrate and an intermediate space, wherein the separating wall has one or a plurality of openings and is arranged between the substrate and the first housing section, wherein the separating wall serves as a diffusion barrier for a gas exchange between the process space and the intermediate space during the thermal processing, but enables a gas exchange between the process space and the intermediate space before and after the thermal processing, and wherein the housing is provided with at least one sealable gas passage opening into the hollow space, for evacuating and introducing gas into the hollow space;
a cooling device for cooling the first housing section;
at least one loading/unloading unit for loading and/or unloading the process box,
at least one heating unit for heating the substrate in the process box;
at least one cooling unit for cooling the substrate in the process box;
at least one pumping-out device for draining the hollow space of the process box;
at least one gas supply device for supplying the hollow space of the process box with at least one gas;
at least one transport mechanism, which is implemented for the purpose of executing a relative movement between the process box and each one of the heating unit, cooling unit, and loading/unloading unit.

2. System according to claim 1, wherein the pumping-out device and the gas supply device are integrated into the loading/unloading unit.

3. System according to claim 2, which comprises:
a) a serial arrangement of stationary groups of units, wherein the groups consist in each case of one cooling unit, one heating unit, and one loading/unloading unit, wherein the process box is transportable and the transport mechanism is implemented for bidirectional transport of the process box;
or
b) a serial arrangement of groups of units, wherein the groups consist in each case of one cooling unit, one heating unit, and one loading/unloading unit, wherein the units are in each case transportable and the process box is stationary, wherein the transport mechanism is implemented for bidirectional transport of the units.

4. System according to claim 1, wherein the cooling device is integrated into the heating unit.

5. System according to claim 1, wherein
a) the loading/unloading unit, the heating unit, and the cooling unit are in each case stationary and the process box is transportable, wherein the transport mechanism is implemented for the purpose of transporting the process box relative to the loading/unloading unit, heating unit, and cooling unit;
or
b) the process box is stationary and the loading/unloading unit, the heating unit, and the cooling unit are in each case transportable, wherein the transport mechanism is implemented for the purpose of transporting the loading/unloading unit, the heating unit, and the cooling unit relative to the process box.

6. System according to claim 1, wherein the loading/unloading unit, the heating unit, and the cooling unit are arranged along a circulating transport route for the process box stationary, in each case, such that the transport route can be traversed unidirectionally, wherein the process box is transportable and the transport mechanism is implemented for the purpose of transporting the process box unidirectionally.

7. System according to claim 1, which comprises:
a) a serial arrangement of stationary units, which consists of one heating unit, two cooling units, which are situated on both sides of the heating unit, and two loading/unloading units for loading and unloading the process box, between which the other units are situated, wherein the process box is transportable and the transport mechanism is implemented for bidirectional transport of the process box;
or
b) a serial arrangement of transportable units, which consists of one heating unit, two cooling units, which are situated on both sides of the heating unit, and two loading/unloading units for loading and unloading the process boxes, between which the other units are situated, wherein the process box is stationary and the transport mechanism is implemented for bidirectional transport of the units.

8. System according to claim 1, which comprises:
a) a serial arrangement of stationary groups of units, wherein the groups consist in each case of one cooling unit, one heating unit, one cooling unit, as well as one loading/unloading unit, wherein the process box is transportable and the transport mechanism is implemented for bidirectional transport of the process box; or
b) a serial arrangement of groups of units, wherein the groups consist in each case of one cooling unit, one heating unit, one cooling unit, as well as one loading/unloading unit, wherein the units are in each case transportable and the process box is stationary, wherein the transport mechanism is implemented for bidirectional transport of the units.

9. System according to claim 1, wherein the pumping-out device and/or the gas supply device and/or the cooling device is permanently coupled during a relative movement between the process box and the heating unit, cooling unit, and loading/unloading unit permanent.

10. Method for processing coated substrates, comprising:
loading a hollow space of an evacuable process box with at least one coated substrate, wherein the hollow space is divided by at least one separating wall into a process space for accommodating the substrate and an intermediate space,
gas-tight sealing of the hollow space of the process box,
pumping out the hollow space of the process box,
filling the hollow space of the process box with at least one gas,
thermal processing of the substrate by electromagnetic thermal radiation, which is generated by radiant heaters arranged outside the process box and impinges on at least one second housing section of the process box serving for thermal processing,
cooling the hot substrate,
removing the cooled substrate from the process box,
cooling at least one first housing section of the process box during and optionally after the thermal processing, the first and second housing sections being different from each other:
inhibiting the diffusion a gaseous material generated during the thermal processing to the cooled first housing section by means of a separating wall provided with one or a plurality of openings, which is arranged between the coated substrate and the cooled first housing section, wherein the separating wall serves as a diffusion barrier for a gas exchange between the process space and the intermediate space during the thermal processing, but enables a gas exchange between the process space and the intermediate space before and after the thermal processing.

11. Method according to claim 10, wherein the process box circulates unidirectionally along a closed transport route, wherein the process box is successively transported to a loading unit for loading the process box with the substrate, to at least one heating unit for thermal processing of the substrate, to at least one cooling unit for cooling the substrate, and to one unloading unit for removing the substrate from the process box.

12. Method according to claim 10, which comprises
loading the transportable process box by means of a stationary loading/unloading unit with a substrate,
transporting the process box, in one direction, to a stationary heating unit and thermal processing of the substrate,
transporting the process box, in the one direction or the opposite direction, to a stationary cooling unit and cooling the substrate, and
transporting the process box, in the opposite direction, to the loading/unloading unit and removing the substrate.

13. Method according to claim 10, comprising:
loading a transportable first process box by means of a stationary first loading/unloading unit with a first substrate,
loading a transportable second process box by means of a stationary second loading/unloading unit with a second substrate,
transporting the first process box, in one direction, to a stationary heating unit and thermal processing of the first substrate,
transporting the first process box, in the opposite direction, to a stationary first cooling unit and cooling the first substrate,
transporting the second process box, in the opposite direction, to the heating unit and thermal processing of the second substrate,
transporting the second process box, in the one direction, to a stationary second cooling unit and cooling the second substrate,
transporting the first process box, in the opposite direction, to the first loading/unloading unit and removing the first substrate, and
transporting the second process box, in the one direction, to the second loading/unloading unit and removing the second substrate.

14. Method according to claim 10, which comprises:
loading the stationary process box by means of a transportable loading/unloading unit with a substrate,
removing the loading/unloading unit, in one direction, from the process box,
transporting a heating unit, in the one direction, to the process box and thermal processing of the substrate,
removing the heating unit, in the other direction, from the process box,
transporting one cooling unit, in the one direction or the opposite direction, to the process box and cooling the substrate,
removing the cooling unit, in the one direction or the opposite direction, from the process box, and
transporting loading/unloading unit, in the opposite direction, to the process box and removing the substrate.

15. Method according to claim 10, comprising:
loading one stationary first process box by means of a first loading/unloading unit with a first substrate,
removing the first loading/unloading unit, in one direction, from the first process box,
loading one stationary second process box by means of a second loading/unloading unit with a second substrate,
removing the second loading/unloading unit, in the opposite direction, from the second process box,
transporting a heating unit, in the one direction, to the first process box and thermal processing of the first substrate,
removing the heating unit, in the opposite direction, from the first process box,
transporting a first cooling unit, in the one direction, to the first process box, and cooling the first substrate,
removing the first cooling unit, in the opposite direction, from the first process box, transporting the heating unit, in the opposite direction, to the second process box and thermal processing of the second substrate, removing the heating unit, in the one direction, from the second process box, and thermal processing of the second substrate, transporting a second cooling unit, in the opposite direction, to the second process box and cooling the second substrate, removing the second cooling unit, in the one direction, from the second process box, transporting the first loading/unloading unit, in the opposite direction, to the first process box and removing the first substrate, transporting the second loading/unloading unit, in the one direction, to the second process box and removing the second substrate.

\* \* \* \* \*